United States Patent
Park et al.

(10) Patent No.: US 12,302,706 B2
(45) Date of Patent: May 13, 2025

(54) THIN FILM TRANSISTOR AND DISPLAY APPARATUS INCLUDING THE SAME

(71) Applicant: LG Display Co., Ltd., Seoul (KR)

(72) Inventors: Moonho Park, Gyeonggi-do (KR); Sangsoon Noh, Gyeonggi-do (KR); Dongchae Shin, Gyeonggi-do (KR); Sunyoung Choi, Gyeonggi-do (KR); Mijin Jeong, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 72 days.

(21) Appl. No.: 18/211,757

(22) Filed: Jun. 20, 2023

(65) Prior Publication Data
US 2024/0008309 A1    Jan. 4, 2024

(30) Foreign Application Priority Data
Jun. 30, 2022  (KR) .......................... 10-2022-0080462

(51) Int. Cl.
*H10K 59/121*    (2023.01)
*G06F 3/041*     (2006.01)
(Continued)

(52) U.S. Cl.
CPC ....... *H10K 59/1213* (2023.02); *G06F 3/0412* (2013.01); *G06F 3/0446* (2019.05); *H10K 59/123* (2023.02); *H10K 59/124* (2023.02); *H10K 59/126* (2023.02); *H10K 59/131* (2023.02); *H10K 59/40* (2023.02); *H10K 59/873* (2023.02); *G09G 3/3233* (2013.01); *G09G 2300/0426* (2013.01); *G09G 2300/0819* (2013.01); *G09G 2300/0842* (2013.01); *G09G 2300/0861* (2013.01)

(58) Field of Classification Search
CPC .... H10K 59/123; H10K 59/131; H10K 59/40; H10K 59/873; H10K 59/126; H10K 59/1213; H10K 59/124; G06F 3/0446; G06F 3/0412; G09G 2310/0262; G09G 2320/043; G09G 2300/0842; G09G 3/3233; G09G 2300/0426; G09G 2310/0251; G09G 2300/0819; G09G 2300/0861
See application file for complete search history.

(56) References Cited

U.S. PATENT DOCUMENTS

2021/0335242 A1* 10/2021  Kim ...................... G09G 3/3233
2023/0147646 A1*  5/2023  Kim ...................... H10K 59/873
                                                                    257/40

* cited by examiner

*Primary Examiner* — Deeprose Subedi
(74) *Attorney, Agent, or Firm* — Morgan, Lewis & Bockius LLP

(57) ABSTRACT

A thin film transistor, in one or more examples, includes a semiconductor layer, an upper gate electrode overlapped with the semiconductor layer, an upper insulating layer disposed between the semiconductor layer and the upper gate electrode, a first lower gate electrode overlapped with the semiconductor layer, a second lower gate electrode disposed between the semiconductor layer and the first lower gate electrode, overlapped with the semiconductor layer, and configured to have a width smaller than that of the upper gate electrode, a first lower insulating layer disposed between the first lower gate electrode and the second lower gate electrode, and a second lower insulating layer disposed between the second lower gate electrode and the semiconductor layer. A display apparatus including a thin film transistor is also disclosed.

44 Claims, 13 Drawing Sheets

(51) Int. Cl.
*G06F 3/044* (2006.01)
*H10K 59/123* (2023.01)
*H10K 59/124* (2023.01)
*H10K 59/126* (2023.01)
*H10K 59/131* (2023.01)
*H10K 59/40* (2023.01)
*H10K 59/80* (2023.01)
*G09G 3/3233* (2016.01)

THIN FILM TRANSISTOR AND DISPLAY APPARATUS INCLUDING THE SAME

CROSS-REFERENCE TO RELATED APPLICATION

This application claims the benefit of and priority to Korean Patent Application No. 10-2022-0080462 filed on Jun. 30, 2022, the entirety of which is incorporated herein by reference for all purposes.

BACKGROUND

1. Technical Field

The present disclosure relates to apparatuses and particularly to, for example, without limitation, a thin film transistor and a display apparatus including the same.

2. Discussion of the Related Art

A display apparatus, such as a liquid crystal display apparatus and an organic light emitting display apparatus, includes a display panel, and has advantages of thin profile, lightness in weight, and low power consumption.

The display panel can include a plurality of gate lines and a plurality of data lines, and the gate lines and the data lines cross each other to form a pixel area. The pixel area can include one or more thin film transistors TFTs, and the thin film transistor can control the amount of light emitted from the pixel area by adjusting the magnitude of a voltage or a current applied to organic light emitting diodes or liquid crystal molecules for each pixel area.

Depending on the material of semiconductor included in the thin film transistor, the thin film transistor can be referred to as, or may be classified as, an amorphous silicon thin film transistor a-Si TFT, a polycrystalline silicon thin film transistor poly-Si TFT, an oxide thin film transistor oxide TFT, and the like.

A dual oxide thin film transistor has high electron mobility as compared to the amorphous silicon thin film transistor, whereby the dual oxide thin film transistor can be used in a high performance display apparatus. In addition, a manufacturing process of the dual oxide thin film transistor is similar to that of the amorphous silicon thin film transistor, whereby the dual oxide thin film transistor provides an advantageous aspect in that it can be manufactured by existing facilities.

However, when the oxide thin film transistor is used for a long period, its internal resistance is increased to generate heat, and the generated heat can change the characteristics of the oxide thin film transistor.

A change in the characteristic of the oxide thin film transistor caused by heat may be referred to as a bias temperature stress, and a performance can be degraded due to a change in a threshold voltage of the oxide thin film transistor.

For example, when a positive bias temperature stress PBTS occurs, the threshold voltage of the oxide thin film transistor is increased, thereby reducing a current flowing through the transistor.

On the other hand, when a negative bias temperature stress NBTS occurs, the threshold voltage of the oxide thin film transistor is lowered, thereby increasing a current flowing through the transistor.

When the change caused by the degradation of the oxide thin film transistor is not compensated, a difference in driving performance may be seen in the pixel areas, and the lifespan of the display apparatus can be shortened. In order to appropriately reduce the change in the threshold voltage of the oxide thin film transistor, there is a need for a method to address and reduce the degradation of the oxide thin film transistor.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

The inventors of the present disclosure have recognized the problems and disadvantages of the related art, have performed extensive research and experiments, and have developed a new invention. Accordingly, embodiments of the present disclosure are directed to devices and apparatuses that substantially obviate one or more problems due to limitations and disadvantages of the related art.

One or more aspects of the present disclosure are directed to solving such one or more problems and providing a thin film transistor capable of reducing a degradation and a display apparatus including the same.

The aspects of the present disclosure and the problems being solved by the present disclosure are not limited to the foregoing. Other aspects, features and advantages of the present disclosure are set forth in the present disclosure and will also be apparent from the present disclosure or may be learned by practice of the inventive concepts provided herein. Other aspects, features and advantages of the present disclosure may be realized and attained by the descriptions provided in the present disclosure.

In accordance with one or more aspects of the present disclosure, a thin film transistor can include a semiconductor layer, an upper gate electrode overlapped with the semiconductor layer, an upper insulating layer disposed between the semiconductor layer and the upper gate electrode, a first lower gate electrode overlapped with the semiconductor layer, a second lower gate electrode disposed between the semiconductor layer and the first lower gate electrode, overlapped with the semiconductor layer, and configured to have a width smaller than that of the upper gate electrode, a first lower insulating layer disposed between the first lower gate electrode and the second lower gate electrode, and a second lower insulating layer disposed between the second lower gate electrode and the semiconductor layer.

In accordance with one or more aspects of the present disclosure, a display apparatus may include a plurality of pixels, each including a thin film transistor, wherein the thin film transistor includes: a semiconductor layer; an upper gate electrode insulated from the semiconductor layer and overlapped with the semiconductor layer; a first lower gate electrode insulated from the semiconductor layer and overlapped with the semiconductor layer; and a second lower gate electrode disposed between the semiconductor layer and the first lower gate electrode, insulated from the semiconductor layer and overlapped the semiconductor layer, wherein an overlapping width between a channel region of the semiconductor layer and the second lower gate electrode is smaller than an overlapping width between the channel region of the semiconductor layer and the upper gate electrode.

In accordance with one or more aspects of the present disclosure, a display apparatus may include: a substrate; a display area; a non-display area outside of the display area; and a plurality of pixels disposed on the substrate and configured to include a first transistor, a second transistor, and an emission element disposed on the first transistor and the second transistor. The first transistor may include: a first semiconductor layer disposed on an upper buffer layer; an upper gate electrode overlapped with the first semiconductor layer with an upper gate insulating layer interposed therebetween; a first lower gate electrode overlapped with the first semiconductor layer; and a second lower gate electrode overlapped with the first semiconductor layer. At least one sub-buffer layer of the upper buffer layer may include sub-buffer layers interposed therebetween. The second lower gate electrode may have a width smaller than a width of the upper gate electrode. The first lower gate electrode may be disposed under the second lower gate electrode. The first transistor may further include: a first insulating interlayer disposed on or under the first lower gate electrode; a second insulating interlayer covering the upper gate electrode; a lower gate insulating layer disposed under the first lower gate electrode; and a source electrode and a drain electrode disposed on the second insulating interlayer and connected to the first semiconductor layer through respective first and second contact holes passing through the second insulating interlayer and the upper gate insulating layer.

Other devices, apparatuses, methods, features and advantages will be, or will become, apparent to one with skill in the art upon examination of the following figures and detailed description. It is intended that all such additional devices, apparatuses, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles of the disclosure. In the drawings.

Figure 1:
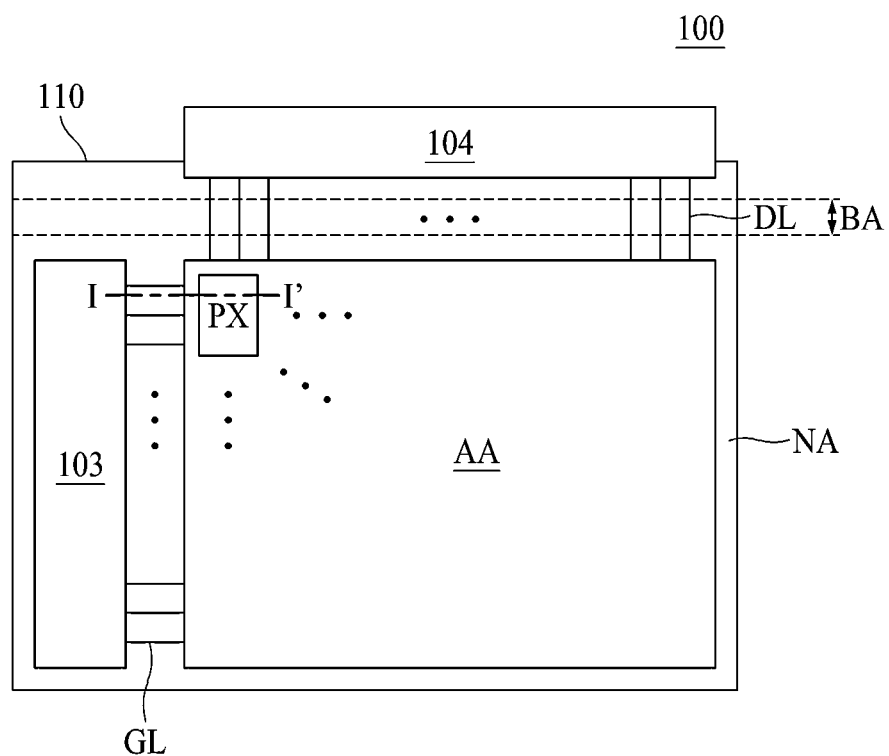
FIG. 1 illustrates a display apparatus according to one or more example embodiments of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure can, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

The shapes, dimensions (e.g., sizes, lengths, widths, heights, thicknesses, locations, radii, diameters, and areas), ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. "Embodiments," "examples," "aspects" and the like should not be construed to be preferred or advantageous over other implementations. Further, the term "may" encompasses all the meanings of the term "can."

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "upon," "on top of," "over," "under," "above," "below," "beneath," "near," "close to," "adjacent to," "beside," or "next to" another structure, this description should be construed as including a case in which the structures contact each other directly as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the terms "first," "second," and the like may be used herein to describe various elements (e.g., layers, films, regions, components, sections, or the like), these elements should not be limited by these terms. These terms are used only to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, or the like) is "connected," "coupled," "attached," or "adhered" to another element, the element can not only be directly connected, coupled, attached, or adhered to another element, but also be indirectly connected, coupled, attached, or adhered to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure can be partially or entirely coupled to or combined with each other, can be technically associated with each other, and may be variously operated, linked or driven together. The embodiments of the present disclosure can be implemented or carried out independently of each other or can be implemented or carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

In one or more embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Further, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode.

Hereinafter, embodiments of the present disclosure are described with reference to the drawings.

FIG. 1 is a plan view illustrating a display apparatus according to one or more example embodiments of the present disclosure.

A display apparatus 100 according to one or more example embodiments of the present disclosure includes a display panel 110.

The display panel 110 includes an active area AA in which a plurality of subpixels PX are disposed, and a non-active area NA disposed outside of the active area AA (or in a periphery area of the display panel 110). For example, a substrate of the display panel 110 may be formed of a plastic material having flexibility capable of being bendable. For example, the substrate is formed of a material such as polyimide PI, polyethylene terephthalate PET, polyethylene naphthalate PEN, polycarbonate PC, polyethersulfone PES, polyarylate PAR, polysulfone PSF, cyclic-olefin copolymer COC, and/or the like. However, glass is not excluded from the material of the substrate in this example.

A subpixel PX of the active area AA includes a thin film transistor using an oxide semiconductor material as an active layer.

At least one of a data driver 104 and a gate driver 103 can be disposed in the non-active area NA of the display panel 110. In addition, the non-active area NA can further include a bending area BA in which the substrate of the display panel 110 is bent or bendable.

The gate driver 103 can include a thin film transistor directly formed on the substrate of the display panel 110. The gate driver 103 can include a thin film transistor using a polycrystalline semiconductor material as an active layer. Alternatively, the gate driver 103 can include a thin film transistor using a polycrystalline semiconductor material as an active layer and a complementary metal-oxide-semiconductor C-MOS transistor including a thin film transistor using an oxide semiconductor material as an active layer.

The thin film transistor having the oxide semiconductor layer and the thin film transistor having the polycrystalline semiconductor layer have high electron mobility in a channel, thereby realizing high resolution and low power consumption.

In one or more examples, an oxide semiconductor may refer to a type of semiconductor material where a primary component is an oxide compound. Oxide semiconductors may include metal cations combined with oxygen anions, resulting in an oxide compound that exhibits semiconductor behavior. In one or more examples, a polycrystalline semiconductor may refer to a type of semiconductor material that includes multiple crystalline regions or grains. Unlike a single crystal semiconductor (which has a continuous and uniform crystal lattice structure), polycrystalline semiconductors may include numerous small crystal regions or grains with different orientations and boundaries between them.

A plurality of data lines DL and a plurality of gate lines GL can be disposed in the active area AA. For example, the plurality of data lines DL can be arranged in rows or columns, and the plurality of gate lines GL can be arranged in columns or rows. The subpixel PX can be disposed in an area defined by the data line DL and the gate line GL.

The gate driver 103 can be disposed in the non-active area NA. The gate driver 103 sequentially drives the respective pixel rows of the active area AA by sequentially supplying a scan signal to the plurality of gate lines GL. Herein, the gate driver 103 can be also referred to as a scan driver. A pixel row refers to a row formed by pixels connected to one gate line.

The gate driver 103 can be configured with a thin film transistor having a polycrystalline semiconductor layer, can be configured with a thin film transistor having an oxide semiconductor layer, or can be configured with a pair of a thin film transistor having a polycrystalline semiconductor layer and a thin film transistor having an oxide semiconductor layer. If the same semiconductor material is used in the thin film transistor disposed in the non-active area NA and the thin film transistor disposed in the active area AA, the same process can be simultaneously performed in the non-active area NA and the active area AA.

The gate driver 103 can include a shift register, a level shifter, and the like.

Figure 5:
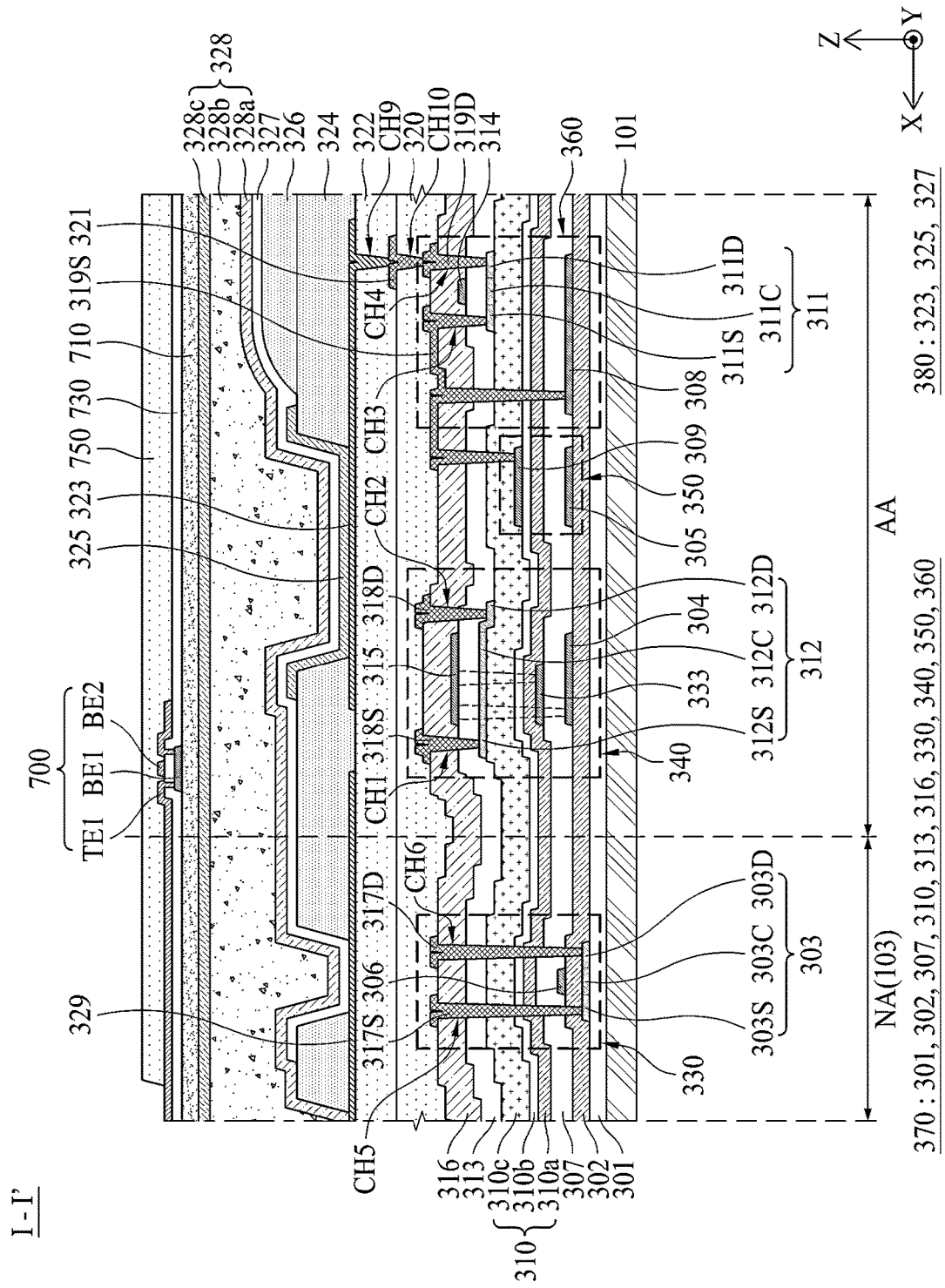
FIG. 5 is a cross-sectional view illustrating a display apparatus according to one or more example embodiments of the present disclosure.

In the display apparatus according to one or more example embodiments of the present disclosure, the gate driver 103 can be implemented in a gate-in panel GIP type and can be directly disposed on the substrate 101 (see FIG. 5).

The gate driver 103 sequentially supplies the scan signal of a gate-on voltage or a gate-off voltage to the plurality of gate lines GL.

The display apparatus 100 according to one example embodiment of the present disclosure can further include the data driver 104. The data driver 104 converts image data into analog data voltages and supplies the data voltages to the plurality of data lines DL when a specific gate line is driven by the gate driver 103.

The plurality of gate lines GL can include a plurality of scan lines and a plurality of emission control lines. The plurality of scan lines and the plurality of emission control lines are wirings for transmitting different types of gate signals (scan signals and emission control signals) to gate nodes of different types of transistors (scan transistors and emission control transistors) disposed in the subpixel PX.

The gate driver 103 can include a scan driving circuit for outputting the scan signals to the plurality of scan lines which are one type of gate lines GL and an emission driving circuit for outputting the emission control signals to the plurality of emission control lines which are different types of gate lines.

The data lines DL can be arranged to pass through the bending area BA, and various data lines DL can be arranged to be connected to the data driver 104 through data pads.

The bending area BA can be an area in which the substrate of the display panel 110 is bent or bendable. The substrate of the display panel 110 can be maintained in a flat state in an area excluding the bending area BA.

Figure 2:
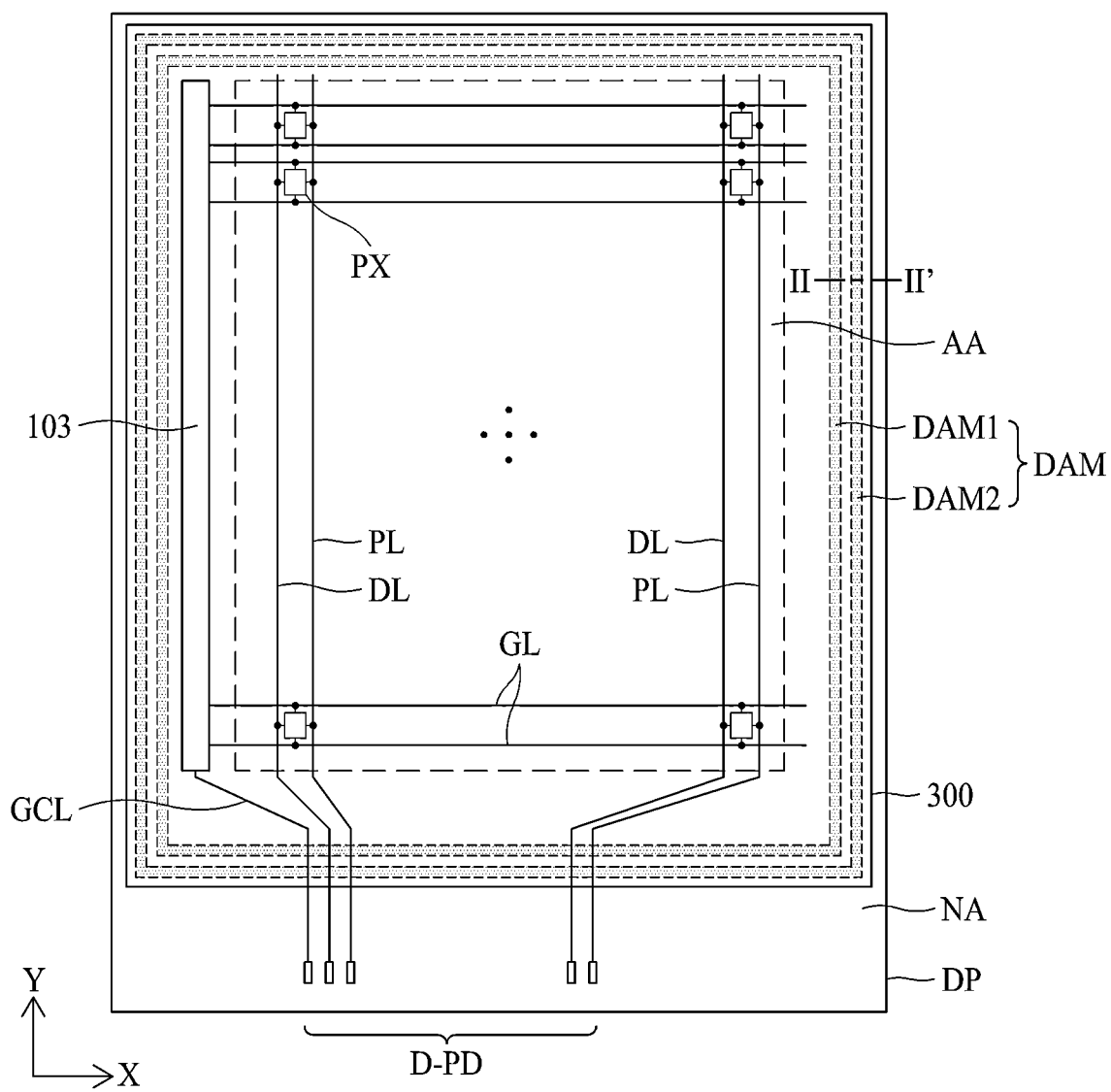
FIG. 2 is a plan view illustrating a display apparatus according to one or more example embodiments of the present disclosure.
Figure 3:
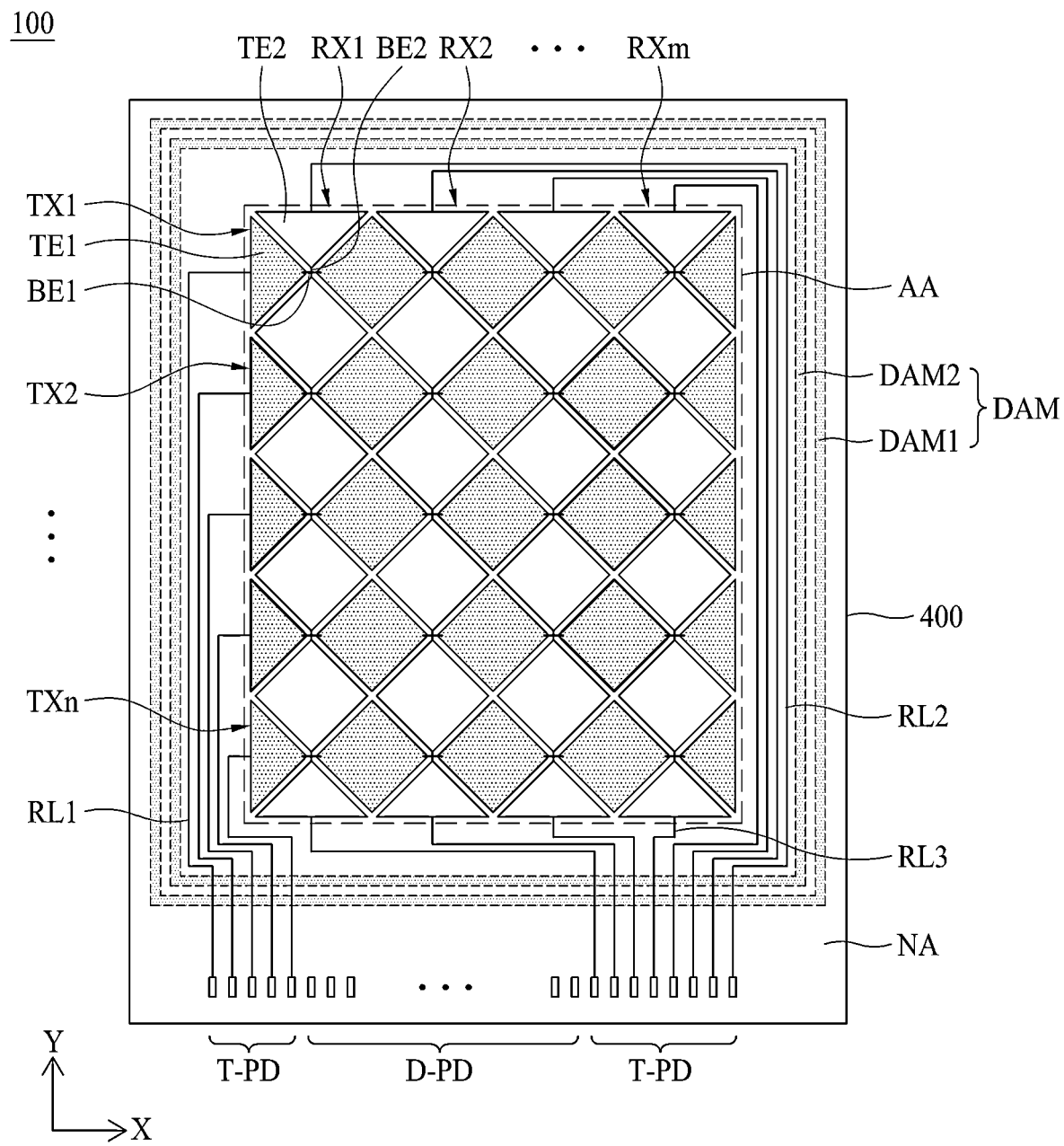
FIG. 3 is a plan view illustrating a display apparatus including a touch sensor according to one or more example embodiments of the present disclosure.

FIGS. 2 and 3 are plan views illustrating a display portion, an encapsulation portion, and a touch sensor portion in a touch display apparatus according to one example embodiment of the present disclosure.

Referring to FIGS. 2 and 3, a display apparatus 100 according to one or more example embodiments of the present disclosure includes an active area AA having an image display function and a touch sensing function, and a bezel area NA disposed outside of the active area AA (or in an outer area of a display portion DP). The active area AA can be represented as a display area, a pixel matrix area, or a touch sensing area. The bezel area NA can be represented as a non-active area, a non-display area, or a touch non-sensing area.

The display apparatus 100 can have a panel structure comprising a circuit element layer (or driving element portion) including a plurality of thin film transistors TFTs for displaying an image, a display portion DP in which an emission element layer (or emission element portion) including a plurality of emission elements is stacked, an encapsulation portion (or layer) 300 disposed on the display portion DP to seal the emission element layer, and a touch sensor portion 400 disposed on the encapsulation portion 300 with an organic buffer layer having a substantial thickness therebetween and configured to have a touch sensing function. An end portion of the organic buffer layer with substantial thickness and an end portion of the encapsulation portion 300 with substantial thickness are arranged in a stepped shape to have a stepped end profile. In addition, the display apparatus 100 can further include an optical function film including a polarizing film attached to the touch sensor portion 400, an optical clear adhesive OCA, a cover substrate, a protection film, and the like.

A pixel array including a plurality of wirings and a plurality of subpixels PX for displaying an image is disposed in the active area AA of the display portion DP. The plurality of subpixels PX can include a red subpixel, a green subpixel, and a blue subpixel, and can further include a white subpixel for improving luminance. Each subpixel PX is connected to a plurality of signal lines including a gate line GL, a data line DL, and a power line PL. Each subpixel PX includes an emission element and a pixel circuit for independently driving the emission element. The emission element can be an organic light emitting diode, a quantum-dot light emitting diode, or an inorganic light emitting diode. Hereinafter, the emission element as the organic light emitting diode is described as an example. The pixel circuit can include a plurality of TFTs including at least a driving TFT and a switching TFT, and a storage capacitor. The display portion DP has a structure in which the circuit element layer including the plurality of pixel circuits arranged in the active area AA and the emission element layer including the plurality of emission elements arranged in the active area AA are stacked.

In the bezel area NA of the display portion DP, the circuit element layer including a plurality of signal lines and a plurality of display pads D-PD connected to the active area AA is located. The signal lines of the bezel area NA can include link lines and power supply lines respectively connected to the signal lines GL, DL, and PL of the active area AA. The plurality of display pads D-PD for connection between the signal lines of the bezel area NA and a display driving portion are disposed in a pad area provided at one side of the bezel area NA. The display portion DP can have a structure including a lower pad of the display pad D-PD and being connected to an upper pad arranged in the touch sensor portion 400 which is described later.

A gate driver 103 for driving the plurality of gate lines GL of the active area AA can be disposed at one side or both sides of the bezel area NA of the display portion DP. The gate driver 103 can be disposed at one side or both sides of the bezel area NA adjacent to the active area AA in a first direction X. The gate driver 103 including the plurality of TFTs can be formed in the circuit element layer with a TFT array of the active area AA. The gate driver 103 receives control signals from the display driving portion through the signal lines GCL and display pads D-PD arranged in the bezel area NA.

The display driving portion can be mounted on the pad area in which the display pads D-PD are located or can be mounted on a circuit film, and then can be connected to the display pads D-PD through an anisotropic conductive film. The display pads D-PD can be disposed on one side of the bezel area NA adjacent to the active area AA in a second direction Y. The circuit film can be any one of a chip on film COF, a flexible printed circuit FPC, and a flexible flat cable FFC. The display driving portion can include a timing controller, a gamma voltage generator, a data driver, and the like.

The encapsulation portion 300 disposed on or in the display portion DP can be disposed to overlap the entire active area AA, to extend to the bezel area NA, and to overlap a dam portion DAM disposed in the bezel area NA. The encapsulation portion 300 seals and protects the emission element layer of the display portion DP. The encapsulation portion 300 can include a stack structure of a plurality of inorganic encapsulation layers for blocking moisture and oxygen penetration, and at least one organic encapsulation layer for blocking particle inflow or flow. The encapsulation portion 300 has a structure in which the organic encapsulation layer having a substantial thickness that can adequately cover particles is disposed between the inorganic encapsulation layers having an insubstantial thickness (or a minimal thickness). The organic encapsulation layer can be referred to as a particle cover layer PCL.

The dam portion DAM is disposed in the bezel area NA to restrain the end of the organic encapsulation layer in the encapsulation portion 300, thereby preventing the organic encapsulation layer from flowing down or collapsing. For example, the dam portion DAM can include a plurality of dams DAM1 and DAM2 in the form of a closed loop surrounding an area including the active area AA of the display portion DP and the gate driver 103.

The touch sensor portion 400 on the encapsulation portion 300 can use a capacitance method for providing a signal, in which the amount of a capacitance change caused by a user's touch is reflected, to a touch driving portion. The touch sensor portion 400 can use a self-capacitance method for independently providing a signal in which the amount of a capacitance change of each touch electrode is reflected to the touch driving portion, or a mutual capacitance method for providing a signal, in which the amount of a capacitance change between first and second touch electrodes is reflected, to the touch driving portion.

Each of the plurality of touch electrodes constituting the self-capacitance type touch sensor portion 400 includes a capacitance formed in the touch electrode itself, whereby the touch sensor is used as the self-capacitance type touch sensor for sensing a capacitance change caused by a user's touch. The plurality of touch electrodes can be individually connected to a plurality of touch lines, respectively. For example, each of the plurality of touch electrodes is electrically connected to any one of the plurality of touch lines crossing the touch electrodes, and is electrically insulated from the remaining touch lines. For example, the (m)th touch electrode (where "m" is a natural number) is electrically connected to the (m)th touch line through at least one touch contact hole and is electrically insulated from the remaining touch lines other than the (m)th touch line. The (m+1)th touch electrode is electrically connected to the (m+1)th touch line through at least one touch contact hole and is electrically insulated from the remaining touch lines other than the (m+1)th touch line. Herein, the touch electrode and the touch line can be formed on different layers with a touch insulating layer interposed therebetween, and can be connected through a contact hole penetrating the touch insulating layer.

In the following example embodiments, the mutual capacitance type touch sensor portion 400 is described as an example.

The touch sensor portion 400 includes a plurality of touch electrodes TE1 and TE2 disposed in the active area AA to provide capacitance type touch sensors, and a plurality of connection electrodes BE1 and BE2. The touch sensor portion 400 includes a plurality of touch pads T-PD and plurality of touch routing lines RL1, RL2 and RL3 arranged in the bezel area NA. When the touch sensor portion 400 is formed, upper pads of the display pads D-PD can be provided on the same layer as the upper pad of the touch pads T-PD and can be formed of the same metal material as the upper pad of the touch pads T-PD, and also can be provided on the same layer as the touch electrodes TE1 and TE2 and can be formed of the same metal material as the touch electrodes TE1 and TE2.

The touch sensor portion 400 includes a plurality of first touch electrode channels TX1 to TXn formed by the plurality of first touch electrodes TE1 electrically connected while being arranged at the first direction (X-axis direction, horizontal direction) in the active area AA, and a plurality of second touch electrode channels RX1 to RXm formed by the plurality of second touch electrodes TE2 connected while being arranged in the second direction (Y-axis direction, vertical direction). The adjacent first and second touch electrodes TE1 and TE2 can constitute each touch sensor of the mutual capacitance type.

In each of the first touch electrode channels TXi (where "i"=1, . . . , n, and where "n" is a positive number greater than 1), each of the first touch electrodes TE1 arranged in the first direction X is connected to the adjacent first touch electrode TE1 through the first connection electrode BE1. In each of the second touch electrode channels RXi (where "i"=1, . . . , m, where "n" is a positive number greater than 1), each of the second touch electrodes TE2 arranged in the second direction Y is connected to the adjacent second touch electrode TE2 through the second connection electrode BE2. The first touch electrode TE1 can be referred to as a transmission electrode Tx, and the second touch electrode TE2 can be referred to as a reception electrode Rx. The first touch electrode channel TX1 to TXn can be referred to as a transmission channel, and the second touch electrode channel RX1 to RXm can be referred to as a reception channel or a readout channel. Each of the first and second touch electrodes TE1 and TE2 is formed in a rhombus shape or can be formed in various other polygonal shapes.

The plurality of touch routing lines RL1, RL2 and RL3 connected to the touch electrode channels TX1 to TXn and RX1 to RXm of the active area AA, and the plurality of touch pads T-PD connected to the plurality of touch routing lines RL1, RL2 and RL3 can be disposed in the bezel area NA of the touch sensor portion 400. The plurality of touch routing lines RL1, RL2, and RL3 can overlap the encapsulation portion 300 in the bezel area NA surrounding the active area AA. The touch driving portion can be mounted on the circuit film and can be connected to the touch pads T-PD disposed in the bezel area NA through the anisotropic conductive film.

One end of each of the plurality of first touch electrode channels TX1 to TXn disposed in the active area AA can be connected to the touch driving portion through the plurality of first touch routing lines RL1 and the touch pad T-PD disposed in the bezel area NA. The plurality of first touch routing lines RL1 can be individually connected to the touch pads T-PD disposed in the lower bezel area NA via one of the left and right bezel areas NA and the lower bezel area NA.

Both ends of the plurality of second touch electrode channels RX1 to RXm disposed in the active area AA can be connected to the touch driving portion through the touch pad T-PD and the plurality of second touch routing lines RL2 and the plurality of third touch routing lines RL3 disposed in the bezel area NA. Since the second touch electrode channels RX1 to RXm, which can be used as the readout channel, are longer than the first touch electrode channels TX1 to TXn, both ends of each of the second touch electrode channels RXi are connected to the touch driving portion through the second and third touch routing lines RL2 and RL3, thereby reducing the resistance-capacitance RC delay and improving touch sensing performance.

For example, the plurality of second touch routing lines RL2 can be connected to one end of the second touch electrode channels RX1 to RXm in the upper bezel area NA and can be individually connected to the touch pads T-PD disposed in the lower bezel area NA via the other one of the left and right bezel areas NA and the lower bezel area NA. The plurality of third touch routing lines RL3 can be connected to the other end of the second touch electrode channels RX1 to RXm in the lower bezel area NA, and can be individually connected to the touch pads T-PD disposed in the lower bezel area NA via the lower bezel area NA.

The touch driving portion can drive the plurality of first touch electrode channels TX1 to TXn, receive readout signals output from the plurality of second touch electrode channels RX1 to RXm, and generate touch sensing data using the readout signals. For example, the touch driving portion can generate the touch sensing signal indicating whether there is a touch by comparing the readout signals of two adjacent channels through a differential amplifier, digitally convert the touch sensing signal into touch sensing data and output the touch sensing data to the touch controller. The touch controller can detect the touch coordinates of a touch position based on the touch sensing data and provide the touch coordinates to a host system.

The touch sensor portion 400 according to one example embodiment is disposed on the encapsulation portion 300 with an organic buffer layer having a substantial thickness similar to that of the encapsulation portion 300 disposed therebetween in the active area AA. Accordingly, manufacturing costs can be reduced by simplifying a manufacturing process compared to an attachment method of a touch panel, and touch sense performance can be improved by reducing a parasitic capacitance between the touch sensor portion 400 and the display portion DP, thereby improving product reliability.

An end portion of the organic buffer layer and an end portion of the encapsulation portion are disposed in a stepped shape so that the end portion of the organic buffer layer having a substantial thickness and the end portion of the encapsulation portion have a stepped shape profile. The touch routing lines RL1, RL2 and RL3 are arranged along the stepped shape end of the organic buffer layer and the encapsulation portion 300. For example, each of the touch routing lines RL1, RL2 and RL3 can include a lower routing line disposed along the end portion of the encapsulation portion, and an upper routing line disposed along the end portion of the organic buffer layer and connected to the lower routing line through a contact hole on the end portion of the encapsulation portion. Accordingly, the touch routing lines RL1, RL2, and RL3 are stably formed in the stepped end of the organic buffer layer and the encapsulation portion without a disconnection defect, thereby improving product yield and product reliability.

Figure 4:
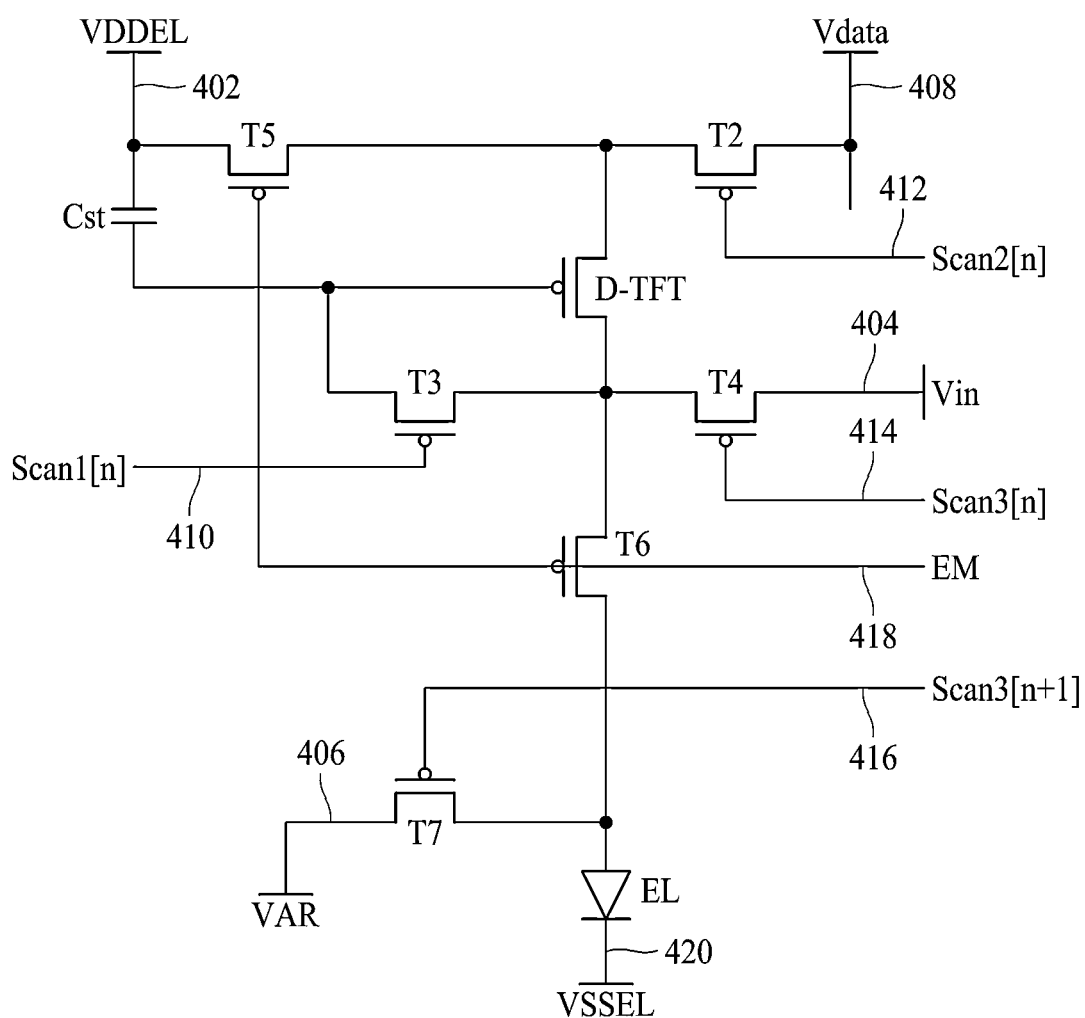
FIG. 4 is a circuit diagram illustrating a pixel driving circuit of a display apparatus according to one or more example embodiments of the present disclosure.

FIG. 4 is a driving circuit diagram of an example of a subpixel. According to one example embodiment of the present disclosure, disclosed is a driving circuit diagram including seven thin film transistors D-TFT, T2 to T7, and one storage capacitor Cst. Herein, one of the seven thin film transistors D-TFT, T2 to T7 is a driving thin film transistor D-TFT, and the remaining transistors T2 to T7 are switching thin film transistors for internal compensation.

The second switching thin film transistor T2 is switched by a second scan signal Scan2[n] supplied to a second gate line 412, and supplies a data voltage Vdata supplied through a data line 408 to a source electrode (or first electrode) of the driving TFT D-TFT.

The third switching thin film transistor T3 is switched by a first scan signal Scan1[n] supplied to a first gate line 410, and is configured to connect a gate electrode and a drain electrode (or second electrode) of the driving TFT D-TFT to a diode structure.

The fourth switching thin film transistor T4 is switched by a third scan signal Scan3[n] supplied to a third gate line 414, and supplies an initialization voltage Vin supplied through an initialization voltage line 404 to the drain electrode (or second electrode) of the driving TFT D-TFT.

The fifth switching thin film transistor T5 is switched by an emission control signal EM supplied to an emission control line 418, and is configured to supply a first power supply voltage VDDEL supplied through a first power line 402 to the source electrode (or first electrode) of the driving TFT D-TFT.

The sixth switching thin film transistor T6 is switched by the emission control signal EM supplied to the emission control line 418, and is configured to electrically connect the drain electrode (or second electrode) of the driving TFT D-TFT and an anode electrode of an emission element EL.

The seventh switching thin film transistor T7 is switched by a fourth scan signal Scan3[n+1] supplied to the fourth gate line 416, and supplies a reset voltage VAR supplied through a reset voltage line 406 to the anode electrode of the emission element EL. The fourth gate line 416 can be the same as the third gate line for supplying the third gate signal Scan3[n+1] to the (n+1)th pixel row (where "n" is a positive integer).

The storage capacitor Cst can be connected between the first power line 402 and the gate electrode of the driving TFT D-TFT. The storage capacitor Cst can charge a voltage difference between a first power supply voltage (e.g., a high potential power voltage) VDDEL and a data voltage Vdata+ Vth having a compensated threshold voltage Vth of the driving TFT D-TFT and can provide the charged voltage difference as a driving voltage of the driving TFT D-TFT.

The driving TFT D-TFT controls a current flowing to the emission element EL through the sixth switching thin film transistor T6 according to the driving voltage charged in the storage capacitor Cst, thereby controlling an emission intensity of the emission element EL.

The emission element EL includes an anode connected to the drain electrode (or second electrode) of the driving TFT D-TFT through the sixth switching thin film transistor T6, a cathode connected to a second power line 420 for supplying a second power supply voltage VSSEL, and an organic emission layer between the anode and the cathode.

As an example of the present disclosure, in case of the driving TFT D-TFT, an oxide semiconductor pattern is used as an active layer, and a switching TFT T3 electrically connected to the driving TFT D-TFT may use an oxide semiconductor pattern as an active layer. In addition, at least one of the remaining switching TFTs for internal compensation can use a polycrystalline semiconductor pattern as an active layer.

However, the present disclosure is not limited to one example illustrated in FIG. 4 and can be applied to internal compensation circuits of various configurations.

Hereinafter, example embodiments of the present disclosure are described in detail with reference to the accompanying drawings.

FIG. 5 illustrates a display apparatus according to one or more example embodiments of the present disclosure. FIG. 5 is an example of a cross-sectional view taken along I-I' of FIG. 1.

Referring to FIGS. 1 and 5, a display apparatus according to one or more example embodiments of the present disclosure can include a subpixel PX, wherein one subpixel PX can include a driving element portion 370 on a substrate 101 and an emission element portion 380 to which the driving element portion 370 is electrically connected. The substrate 101 can include a display area AA and a non-display area NA.

The driving element portion 370 can include a driving thin film transistor 360, a switching thin film transistor 340, and a storage capacitor 350 in the display area AA. The driving element portion 370 can be referred to as an array portion for driving one subpixel. The emission element portion 380 can include an anode electrode 323, a cathode electrode 327, and an emission layer 325 arranged between the anode electrode 323 and the cathode electrode 327, and can be referred to as an array portion for a light emission.

The driving element portion 370 can include a gate driver 103 disposed in the non-display area NA.

In FIG. 5, the driving thin film transistor 360, the switching thin film transistor 340, the storage capacitor 350, and a driving circuit thin film transistor 330 of the gate driver 103 are illustrated as an example of the driving element portion 370. The gate driver 103 may include, or may be, a gate driving circuit disposed in the non-display area NA. The gate driving circuit may include a plurality of thin film transistors. In one or more examples, each of the plurality of thin film transistors (included in the gate driving circuit) may include, or may be, a transistor that is the same as or similar to the driving circuit thin film transistor 330. Referring to FIGS. 4 and 5, in one or more examples, the driving thin film transistor D-TFT of FIG. 4 may substantially correspond to, or may substantially include, the driving thin film transistor 360 of FIG. 5, each of the switching thin film transistors T2 to T7 of FIG. 4 may substantially correspond to, or may substantially include, the switching thin film transistor 340, and the storage capacitor Cst of FIG. 4 may substantially correspond to, or may substantially include, the storage capacitor 350 of FIG. 5.

Referring to FIG. 5, according to one example embodiment of the present disclosure, the driving thin film transistor 360 and at least one switching thin film transistor 340 use an oxide semiconductor material as an active layer. A thin film transistor using an oxide semiconductor material as an active layer has an excellent leakage current blocking effect and a relatively low manufacturing cost compared to a thin film transistor using a polycrystalline semiconductor material as an active layer. Therefore, according to one example embodiment of the present disclosure, a driving thin film transistor using an oxide semiconductor material is manufactured, and at least one switching thin film transistor using an oxide semiconductor material is manufactured to reduce power consumption and reduce manufacturing costs.

All of the driving element portion 370 constituting one subpixel can use a thin film transistor using an oxide semiconductor material, or some of the switching thin film transistors can use an oxide semiconductor material.

However, in comparison to a thin film transistor using an oxide semiconductor material, a thin film transistor using a polycrystalline semiconductor material can be suitable for high speed operation and can be highly reliable in that such transistor can process signals rapidly, enabling fast operation, and such transistor can provide dependable performance over extended periods of time. Accordingly, in case of one example embodiment of the present disclosure shown in FIG. 5, the switching thin film transistor 340 and the driving thin film transistor 360 are manufactured with an oxide semiconductor material, and the driving circuit thin film transistor 330 of the gate driver 103 is manufactured with a polycrystalline semiconductor material. However, the present disclosure is not limited to the example embodiment shown in FIG. 5.

The substrate 101 can be composed of multilayers in which an organic film and an inorganic film are alternately stacked. For example, the substrate 101 can be formed by stacking the organic film such as polyimide and the inorganic film such as silicon oxide $SiO_2$.

A lower buffer layer 301 is formed on the substrate 101. The lower buffer layer 301 can be formed by stacking multi layers of silicon oxide $SiO_2$ so as to prevent moisture permeation from the outside.

A second buffer layer can be further formed on the lower buffer layer 301 to further protect the element from moisture vapor.

The driving circuit thin film transistor 330 is formed on the substrate 101. The driving circuit thin film transistor 330 can use a polycrystalline semiconductor pattern as an active layer, but the present disclosure is not limited thereto. The driving circuit thin film transistor 330 includes a first active layer 303 including a channel through which electrons or holes move, a first gate electrode 306, a first source electrode 317S, and a first drain electrode 317D.

The first active layer 303 is formed of a polycrystalline semiconductor material. Herein, a first channel region 303C is provided in the center of the first active layer 303, and a first source region 303S and a first drain region 303D are provided with the first channel region 303C interposed in-between.

The first source electrode 317S and the first drain electrode 317D are respectively connected to the first source region 303S and the first drain region 303D through a fifth contact hole CH5 and a sixth contact hole CH6. The contact holes CH5 and CH6 are formed to penetrate a second insulating interlayer 316, a second gate insulating layer 313, an upper buffer layer 310, a first insulating interlayer 307, and a first gate insulating layer 302.

The first source region 303S and the first drain region 303D are formed by doping impurity ions of Group 15 or Group 13 of the periodic table, for example, phosphorus P or boron B at a predetermined concentration in an intrinsic polycrystalline semiconductor pattern.

The first channel region 303C provides a path through which electrons or holes move by maintaining the intrinsic state of the polycrystalline semiconductor material.

The driving circuit thin film transistor 330 includes a first gate electrode 306 overlapping the first channel region 303C of the first active layer 303. The first gate insulating layer 302 can be formed between the first gate electrode 306 and the first active layer 303.

In one example embodiment of the present disclosure, the driving circuit thin film transistor 330 can have a top gate type in which the first gate electrode 306 is located above the first active layer 303. As a result, a mask process can be simplified by forming a first storage electrode 305 and a first lower gate electrode 304 together with the first gate electrode 306 made of a first gate electrode material through one mask process.

The first gate electrode 306 is formed of a metal material. For example, the first gate electrode 306 can have a single-layered or a multi-layered structure formed of one or more of molybdenum Mo, aluminum Al, chromium Cr, gold Au, titanium Ti, nickel Ni, neodymium Nd, and copper Cu, or an alloy thereof, but the present disclosure is not limited thereto.

The first insulating interlayer 307 is deposited on the first gate electrode 306. The first insulating interlayer 307 can be formed of silicon nitride SiNx. For example, the first insulating interlayer 307, which is formed of silicon nitride SiNx, can include hydrogen particles. The hydrogen particles form the first active layer 303. When a heat treatment is carried out after depositing the first insulating interlayer 307 on the first active layer 303 formed by the hydrogen particles, the hydrogen particles included in the first insulating interlayer 307 penetrate the first source region 303S and the first drain region 303D, to thereby improve and stabilize conductivity of the polycrystalline semiconductor material. This is also referred to as a hydrogenation process, but the present disclosure is not limited to these terms.

The driving circuit thin film transistor 330 can further include the upper buffer layer 310, the second gate insulating layer 313, and the second insulating interlayer 316 on the first insulating interlayer 307. Also, the driving circuit thin film transistor 330 includes the first source electrode 317S and the first drain electrode 317D which are formed on the second insulating interlayer 316 and are connected to the first source region 303S and the first drain region 303D, respectively.

The upper buffer layer 310 separates the first active layer 303 composed of the polycrystalline semiconductor material and a second active layer 312 of the second switching thin film transistor 340 composed of the oxide semiconductor material, and a third active layer 311 of the driving thin film transistor 360 from each other and provides the basis in which the second active layer 312 and the third active layer 311 are formed.

The second insulating interlayer 316 corresponds to the insulating interlayer for covering an upper gate electrode 315 of the switching thin film transistor 340 and a third gate electrode 314 of the driving thin film transistor 360. Since the second insulating interlayer 316 is formed on the second active layer 312 and the third active layer 311 of an oxide semiconductor material, the second insulating interlayer 316 is formed of an inorganic film which does not include hydrogen particles.

The first source electrode 317S and the first drain electrode 317D can have a single-layered structure or a multi-layered structure formed of one or more of molybdenum Mo, aluminum Al, chromium Cr, gold Au, titanium Ti, nickel Ni, neodymium Nd, and copper Cu, or an alloy thereof, but the present disclosure is not limited thereto.

The switching thin film transistor 340 includes the second active layer 312 which is formed on the upper buffer layer 310 and is composed of a second oxide semiconductor pattern, the second gate insulating layer 313 which covers the second active layer 312, the upper gate electrode 315 which is formed on the second gate insulating layer 313, the second insulating interlayer 316 which covers the upper gate electrode 315, and a second source electrode 318S and a second drain electrode 318D which are formed on the second insulating interlayer 316.

The second source electrode 318S and the second drain electrode 318D are connected to the second source region 312S and the second drain region 312D through a first contact hole CH1 and a second contact hole CH2, respectively, which penetrate the second gate insulating layer 313 and the second insulating interlayer 316. The contact holes CH1 and CH2 are formed to penetrate the second insulating interlayer 316 and the second gate insulating layer 313. FIG. 6B is an enlarged view of a switching thin film transistor 340A according to an experimental example in comparison to the switching thin film transistor 340 of FIG. 5. The switching thin film transistor 340A of FIG. 6B include components having the same reference numerals as those included in the switching thin film transistor 340 of FIG. 5, and the same reference numerals indicate same components. The switching thin film transistor 340A of FIG. 6B is different from the switching thin film transistor 340 of FIG. 5 in that the switching thin film transistor 340A includes a lower gate electrode 333A (rather than a second lower gate electrode 333) disposed under the upper buffer layer 310 and overlapping the active layer 312. Further, the switching thin film transistor 340A does not include a first lower gate electrode 304. A metal such as the lower gate electrode 333A is additionally disposed under the active layer 312 including the oxide semiconductor pattern so that it is possible to prevent hydrogen permeation, thereby stabilizing the element characteristics. For example, the lower gate electrode 333A can be formed of the same material as the upper gate electrode 315 and can be formed on the upper surface of the first insulating interlayer 307. The upper gate electrode 315 and the lower gate electrode 333A can have the same width as a channel region 312C of the second active layer 312. The upper gate electrode 315 and the lower gate electrode 333A can be electrically connected to each other through a contact hole.

Figure 6A:
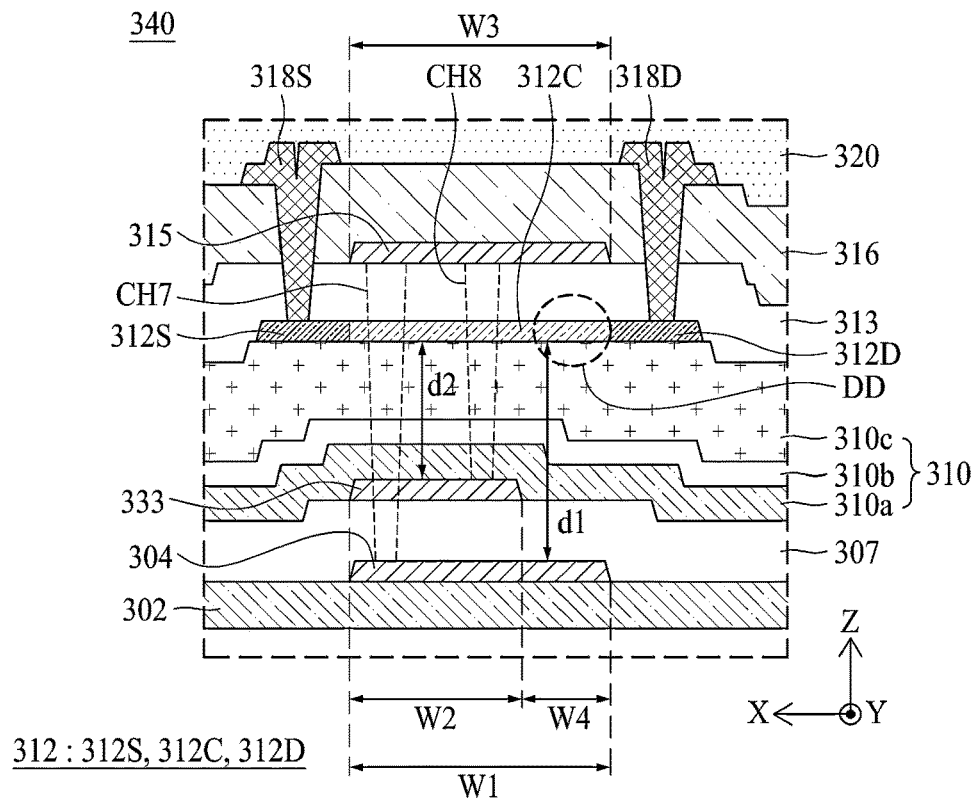
FIG. 6A is a cross-sectional view illustrating a switching thin film transistor according to one or more example embodiments of the present disclosure.
Figure 6B:
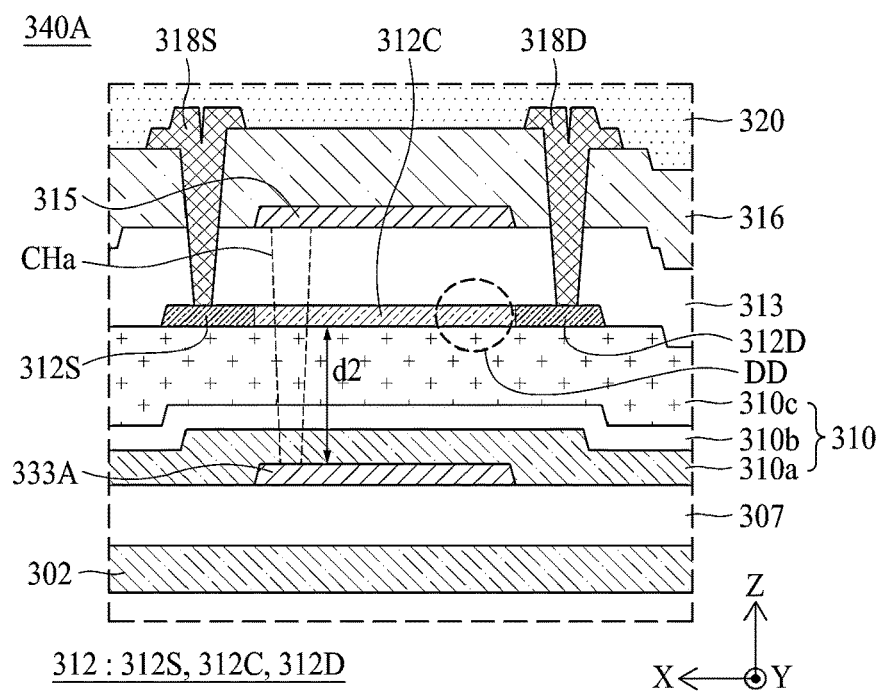
FIG. 6B is a cross-sectional view illustrating a switching thin film transistor according to an experimental example of the present disclosure.

FIG. 6A is an enlarged view of the switching thin film transistor 340 of FIG. 5 according to one or more example embodiments of the present disclosure.

In FIGS. 5 and 6A, the first lower gate electrode 304 and the upper gate electrode 315 are electrically connected through a contact hole CH7, and a second lower gate electrode 333 and the upper gate electrode 315 are electrically connected through a contact hole CH8 to form a triple-layer gate (where the contact holes CH7 and CH8 are shown using dotted lines and represent electrical connections illustrated in the cross-sectional view along the line I-I' of FIG. 1). The switching thin film transistor 340 has a triple-layered gate structure so that the flow of current flowing through the channel region 312C of the second active layer 312 can be controlled more precisely and can be manufactured in a smaller size, thereby realizing a high-resolution display apparatus.

On the other hand, as the switching thin film transistor 340A of the dual gate structure shown in FIG. 6B is driven, a bottleneck phenomenon in which charges are applied to a drain junction portion DD of the channel region 312C in a direction in which the charge moves from the source region 312S of the active layer 312 to the drain region 312D through the channel region 312C can occur, and a hot carrier having a large kinetic energy can be generated. Accordingly, charges of an excessive current can be collected or embedded into a nonconductor, for example, the second gate insulating layer 313 and the upper buffer layer 310, whereby the charges can be collected at the interface between the second gate insulating layer 313 and the upper buffer layer 310 to generate deterioration, thereby causing damage to the drain junction portion DD of the channel region 312C. This can potentially pose a problem and impact the reliability of the element.

In order to solve this problem, the switching thin film transistor 340 according to one or more example embodiments of the present disclosure can increase a thickness of the lower insulating film overlapping the nonconductor of the drain junction portion DD of the channel region 312C, for example, the drain junction portion DD in a third direction Z. The current flowing from the source region 312S to the drain region 312D of the active layer 312 can be weakly (or partially) controlled by increasing a distance "d" in an equation E=V/d, where an electric field E of the drain junction portion DD is determined by dividing the distance d from a voltage V, where the voltage V is a gate voltage, and an electric field inside the channel region 312C can be variously adjusted.

To this end, a first lower gate electrode 304 can be additionally disposed in the switching thin film transistor according to one or more example embodiments of the present disclosure shown in FIGS. 5 and 6A. A width W2 of the second lower gate electrode 333 can be smaller than a width W3 of the upper gate electrode 315 and a width W1 of the first lower gate electrode 304. An overlapping width (e.g., W2) between the second lower gate electrode 333 and the channel region 312C of the second active layer 312 can be smaller than an overlapping width between the first lower gate electrode 304 and the channel region 312C of the second active layer 312. An overlapping width (e.g., W2) between the channel region 312C of the second active layer 312 and the second lower gate electrode 333 can be smaller than an overlapping width between the channel region 312C of the second active layer 312 and the upper gate electrode 315. A region W4, where the difference of the width W2 of the second lower gate electrode 333, as compared with the width W3 of the upper gate electrode 315 and the width W1 of the first lower gate electrode 304 is shown, can be closer to the drain region 312D than the source region 312S.

Accordingly, as compared to the thickness "d2" of the lower insulating layer when only the lower gate electrode 333A is disposed as shown in FIG. 6B, the first lower gate electrode 304 is additionally disposed together with the second lower gate electrode 333 as shown in FIG. 6A, whereby the thickness "d1" of the lower insulating layer of the drain junction portion DD, that is, the nonconductor can increase. Accordingly, by using a structure such as the structure shown in FIG. 6A, it is possible to reduce damage to the drain junction portion DD, the upper buffer layer 310, and the second gate insulating layer 313 in the channel region 312C by cooling down the overheated charges of the drain junction portion DD.

In FIGS. 5 and 6A, the first lower gate electrode 304 is disposed on the first gate insulating layer 302, and the second lower gate electrode 333 is disposed on the first insulating interlayer 307, but the present disclosure is not limited thereto. According to one or more example embodiments of the present disclosure, at least some of the configurations included in the plurality of insulating layers and the plurality of buffer layers can be omitted or other components can be added. In addition, a positional relationship between the first lower gate electrode 304 and the second lower gate electrode 333 in the plurality of insulating layers or the buffer layers can be different. The thickness "d1" of the lower insulating layer of the drain junction portion DD can be varied based on the degree of element performance, such as current, threshold voltage Vth, S factor, and other factors, while maintaining reliability within an acceptable range.

The second active layer 312 is formed of an oxide semiconductor material and is configured to include the second channel region 312C of the intrinsic state which is not doped with impurities, and the second source region 312S and the second drain region 312D which are made conductive by being doped with impurities.

The second source electrode 318S and the second drain electrode 318D can have a single-layered structure or multi-layered structure formed of any one or more of molybdenum Mo, aluminum Al, chromium Cr, gold Au, titanium Ti, nickel Ni, neodymium Nd, and copper Cu or an alloy thereof, in the same manner as the first source electrode 317S and the first drain electrode 317D.

The second source electrode 318S and the second drain electrode 318D and the first source electrode 317S and the first drain electrode 317D can be simultaneously formed of the same material and can be provided on the second insulating interlayer 316, thereby reducing the number of mask processes.

Referring to FIG. 5, the driving thin film transistor 360 is formed on the upper buffer layer 310.

In one example embodiment of the present disclosure, the driving thin film transistor 360 includes the third active layer 311 composed of the first oxide semiconductor pattern. Herein, the first oxide semiconductor pattern and the third active layer 311 are substantially the same as each other and are described by the same reference numerals.

The driving thin film transistor can use a polycrystalline semiconductor pattern, which is advantageous for high-speed operation, as an active layer. However, the driving thin film transistor including the polycrystalline semiconductor pattern generates a leakage current in a turn-off state, which increases power consumption. Accordingly, one example embodiment of the present disclosure provides a driving thin film transistor 360 which uses an oxide semiconductor pattern as the active layer 311, which is advantageous for blocking the occurrence of leakage current.

However, in case of the thin film transistor using the oxide semiconductor pattern as the active layer 311, since the amount of current variation relative to the voltage variation is large due to the characteristic of the oxide semiconductor material, a defect can occur in a low grayscale region requiring a precise current control. Therefore, one example embodiment of the present disclosure provides a driving thin film transistor 360 in which the variation of a current in the active layer 311 is relatively insensitive to the variation of a voltage applied to the gate electrode 314.

Referring to FIG. 5, the driving thin film transistor 360 includes the third active layer 311 including the first oxide semiconductor pattern on the upper buffer layer 310, the second gate insulating layer 313 for covering the third active layer 311, the third gate electrode 314 formed on the second gate insulating layer 313 and overlapping the third active layer 311 in the third direction Z, the second insulating interlayer 316 for covering the third gate electrode 314, and the third source electrode 319S and the third drain electrode 319D disposed on the second insulating interlayer 316.

A third source electrode 319S and a third drain electrode 319D are connected to a third source region 311S and a third drain region 311D through a third contact hole CH3 and a fourth contact hole CH4, respectively, penetrating the second gate insulating layer 313 and the second insulating interlayer 316.

The driving thin film transistor 360 further includes a first light shielding layer 308 disposed under the upper buffer layer 310 and overlapping the third active layer 311 in the third direction Z.

The first light shielding layer 308 is disposed on the first gate insulating layer 302. The first insulating interlayer 307 is disposed on the first gate insulating layer 302. The upper buffer layer 310 can be formed on the first insulating interlayer 307.

The upper buffer layer 310 can have a structure in which a first sub-buffer layer 310a, a second sub-buffer layer 310b, and a third sub-buffer layer 310c are sequentially stacked.

The first sub-buffer layer 310a and the third sub-buffer layer 310c can be formed of silicon oxide $SiO_2$.

Since the first sub-buffer layer 310a and the third sub-buffer layer 310c are composed of silicon oxide $SiO_2$ which does not include hydrogen particles, the first sub-buffer layer 310a and the third sub-buffer layer 310c can serve as a basis for the switching thin film transistor 340 and the driving thin film transistor 360 using the oxide semiconductor pattern as the active layer.

On the other hand, the second sub-buffer layer 310b can be formed of silicon nitride SiNx having excellent collection ability with respect to hydrogen particles. Silicon nitride SiNx has excellent collection ability with respect to hydrogen particles compared to silicon oxide $SiO_2$. Therefore, compared to silicon oxide $SiO_2$, silicon nitride SiNx can more effectively capture and retain hydrogen particles.

For example, the first insulating interlayer 307 including hydrogen particles is disposed under the upper buffer layer 310. In this case, hydrogen particles generated during a hydrogenation process of the driving circuit thin film transistor 330 using the polycrystalline semiconductor pattern as the first active layer 303 can pass through the upper buffer layer 310 and then might reduce reliability of the oxide semiconductor patterns 311 and 312 disposed on the upper buffer layer 310. For example, when hydrogen particles penetrate the oxide semiconductor pattern, the thin film transistors using the oxide semiconductor pattern as the active layer have different threshold voltages or different conductivity channels depending on their formation positions. For example, in case of the driving thin film transistor 360, it directly contributes to an operation of the emission element, whereby it is important to secure reliability.

According to one or more example embodiments of the present disclosure, the first light shielding layer 308 is formed of a metal layer including titanium Ti having excellent collection ability for hydrogen particles. For example, the first light shielding layer 308 can be formed of a single layer of titanium Ti, a double-layered structure of molybdenum Mo and titanium Ti, or an alloy of molybdenum Mo and titanium Ti, but the present disclosure is not limited thereto. For example, the first light shielding layer 308 can be formed of another metal layer including titanium Ti.

Herein, titanium Ti collects hydrogen particles diffused in the upper buffer layer 310 and prevents the hydrogen particles from reaching the first oxide semiconductor pattern 311.

In one or more example embodiments, the second sub-buffer layer 310b including silicon nitride SiNx cannot be deposited on the entire surface of the display area like the first sub-buffer layer 310a, but can be deposited only on a portion of the upper surface of the first sub-buffer layer 310a to selectively cover only the first light shielding layer 308. The second sub-buffer layer 310b is formed of a material different from that of the first sub-buffer layer 310a, for example, silicon nitride layer SiNx. If the second sub-buffer layer 310b of silicon nitride SiNx is deposited on the entire surface of the display area, some portions can be partially lifted. To compensate for this, the second sub-buffer layer 310b is selectively formed only on a location(s) where the first light shielding layer 308 required for its function is formed.

In one or more advantageous example embodiments, the first light shielding layer 308 and the second sub-buffer layer 310b are formed vertically below the first oxide semiconductor pattern 311 while being overlapped with the first oxide semiconductor pattern 311. In addition, the first light shielding layer 308 and the second sub-buffer layer 310b can be larger than the first oxide semiconductor pattern 311 to completely overlap the first oxide semiconductor pattern 311.

The third source electrode 319S of the driving thin film transistor 360 can be electrically connected to the first light shielding layer 308 through a contact hole. The contact hole can be formed to penetrate the second insulating interlayer 316, the second gate insulating layer 313, the upper buffer layer 310, and the first insulating interlayer 307.

Referring to FIG. 5, the driving element portion 370 according to one example embodiment of the present disclosure further includes the storage capacitor 350.

The storage capacitor 350 stores the data voltage applied through the data line for a predetermined time period and provides the stored data voltage to the emission element.

The storage capacitor 350 includes two electrodes corresponding to each other and a dielectric interposed in-between. The storage capacitor 350 comprises a first storage electrode 305 disposed on the first gate insulating layer 302 and formed of the same material as those of the first gate electrode 306 and the first light shielding layer 308, and a second storage electrode 309 disposed on the second sub-buffer layer 310b of the upper buffer layer 310.

The first insulating interlayer 307, the first sub-buffer layer 310a, and the second sub-buffer layer 310b are located between the first storage electrode 305 and the second storage electrode 309.

The second storage electrode 309 of the storage capacitor 350 can be electrically connected to the third source electrode 319S through a contact hole. The contact hole can be formed to penetrate the second insulating interlayer 316, the second gate insulating layer 313, and the third sub-buffer layer 310c of the upper buffer layer 310.

The configuration of the driving element portion 370 constituting a unit pixel of the present disclosure has been described. Since the driving element portion 370 according to one example embodiment of the present disclosure is composed of the plurality of thin film transistors including different types of semiconductor materials, a large number of masks can be used. Therefore, one example embodiment of the present disclosure can have the configuration for simultaneously forming the plurality of layers so as to reduce the number of masks used.

For example, the first gate electrode 306 constituting the driving circuit thin film transistor 330, the first lower gate electrode 304 constituting the switching thin film transistor 340, the first storage electrode 305 constituting the storage capacitor 350, and the first light shielding layer 308 constituting the driving thin film transistor 360 are formed of the same material on the same layer. The upper gate electrode 315 constituting the switching thin film transistor 340 and the third gate electrode 314 constituting the driving thin film transistor 360 are formed of the same material on the same layer.

The first source electrode 317S and the first drain electrode 317D constituting the driving circuit thin film transistor 330, the second source electrode 318S and the second drain electrode 318D constituting the switching thin film transistor 340, and the third source electrode 319S and the third drain electrode 319D constituting the driving thin film transistor 360 are formed of the same material on the same layer.

Referring to FIG. 5, a first planarization layer 320 and a second planarization layer 322 are sequentially formed on the driving element portion 370, to thereby planarize an upper end of the driving element portion 370. The first planarization layer 320 and the second planarization layer 322 can be formed of an organic film such as polyimide or acrylic resin.

Referring to FIG. 5, the emission element portion 380 is formed on the second planarization layer 322.

The driving element portion 370 and the emission element portion 380 are insulated from each other by the planarization layers 320 and 322.

The emission element portion 380 includes the first electrode 323 as the anode electrode, the second electrode 327 as the cathode electrode, and the emission layer 325 interposed between the first electrode 323 and the second electrode 327. The first electrode 323 is formed for each subpixel.

The emission element portion 380 is connected to the driving element portion 370 through a connection electrode 321 formed on the first planarization layer 320. For example, the first electrode 323 of the emission element portion 380 and the third drain electrode 319D of the driving thin film transistor 360 constituting the driving element portion 370 are connected to each other by the connection electrode 321.

The first electrode 323 is connected to the connection electrode 321 exposed through a contact hole CH9 penetrating the second planarization layer 322. In addition, the connection electrode 321 is connected to the third drain electrode 319D exposed through a contact hole CH10 penetrating the first planarization layer 320.

The first electrode 323 can be formed in a multi-layered structure including a transparent conductive film and an opaque conductive film having high reflection efficiency. The transparent conductive film can be made of a material having a relatively large work function value such as indium tin oxide ITO or indium zinc oxide IZO. The opaque conductive film can have a single-layered or multi-layered structure including one or more of aluminum Al, silver Ag, copper Cu, lead Pb, molybdenum Mo, titanium Ti, or an alloy thereof. For example, the first electrode 323 can be formed in a structure in which a transparent conductive film, an opaque conductive film, and a transparent conductive film are sequentially stacked, or can be formed in a structure in which a transparent conductive film and an opaque conductive film are sequentially stacked.

The emission layer 325 is formed by stacking a hole-related layer, an organic emission layer, and an electron-related layer in the order of hole-related layer, organic emission layer, and electron-related layer on the first electrode 323, or in its reverse order.

A bank layer 324 is a pixel definition film for defining the emission area of each subpixel by exposing the first electrode 323 of each subpixel. The bank layer 324 can be formed of an opaque material (e.g., black) to prevent an optical interference between the adjacent subpixels. In this case, the bank layer 324 includes a light blocking material made of at least one of color pigment, organic black, and carbon. A spacer 326 can be further disposed on the bank layer 324.

The second electrode 327 corresponding to the cathode electrode faces the first electrode 323 with the emission layer 325 therebetween and is formed on the upper surface and the lateral surface of the emission layer 325. The second electrode 327 can be integrally formed on the entire surface of the active area. When the second electrode 327 is applied to a top emission type organic light emitting display apparatus, the second electrode 327 can be formed of a transparent conductive film such as indium tin oxide ITO or indium zinc oxide IZO.

An encapsulation portion 328 for suppressing moisture penetration can be further arranged on the second electrode 327.

The encapsulation portion 328 can include a first inorganic encapsulation layer 328a, a second organic encapsulation layer 328b, and a third inorganic encapsulation layer 328c which are sequentially stacked.

The first inorganic encapsulation layer 328a and the third inorganic encapsulation layer 328c of the encapsulation portion 328 can be formed of an inorganic material such as silicon oxide SiOx. The second organic encapsulation layer 328b of the encapsulation portion 328 can be formed of an organic material such as acryl resin, epoxy resin, phenolic resin, polyamide resin, and/or polyimide resin.

A touch sensor layer 700 can include the first touch electrode TE1, the first touch connection electrode BE1, the second touch electrode, and the second touch connection electrode BE2.

A touch buffer layer 710 can be disposed on the encapsulation portion 328. The touch buffer layer 710 can prevent a chemical solution (developer or etchant) used in a manufacturing process of the touch sensor layer 700 or external moisture from penetrating into the emission layer 325 including the organic material. In addition, it is possible to prevent the plurality of touch sensor metals disposed on the touch buffer layer 710 from being disconnected due to an external impact, and to prevent an interference signal which might occur when the touch sensor layer 700 is driven.

The touch buffer layer 710 can be formed in a single-layered or multi-layered structure formed of any one of silicon oxide SiOx or silicon nitride SiNx, or an alloy thereof, but the present disclosure is not limited thereto. Alternatively, the touch buffer layer 710 can be formed of an organic material such as acryl resin, epoxy resin, phenolic resin, polyamide resin, or polyimide resin.

The first touch connection electrode BE1 can be disposed on the touch buffer layer 710.

For example, the first touch connection electrode BE1 can be disposed between the first touch electrodes TE1 adjacent to each other in the first direction (or X-axis direction). The first touch connection electrode BE1 can electrically connect the plurality of first touch electrodes TE1 disposed adjacent to each other in the first direction (or X-axis direction), but the present disclosure is not limited thereto.

The first touch connection electrode BE1 can be disposed to overlap the second touch connection electrode BE2 for connecting the second touch electrodes adjacent to each other in the second direction (or Y-axis direction). Since the first touch connection electrode BE1 and the second touch connection electrode BE2 are formed on different layers, the first touch connection electrode BE1 and the second touch connection electrode BE2 can be electrically insulated from each other.

A touch insulating layer 730 can be disposed on the touch buffer layer 710 and the first touch connection electrode BE1.

The touch insulating layer 730 can include a hole for electrically connecting the first touch electrode TE1 to the first touch connection electrode BE1.

The touch insulating layer 730 can electrically insulate the second touch electrode and the second touch connection electrode BE2 from the first touch connection electrode BE1.

The touch insulating layer 730 can be formed in a single-layered structure of silicon nitride SiNx or silicon oxide SiOx or can be formed in a multi-layered structure of silicon nitride SiNx and silicon oxide SiOx, but the present disclosure is not limited thereto.

The first touch electrode TE1, the second touch electrode, and the second touch connection electrode BE2 can be disposed on the touch insulating layer 730.

The first touch electrode TE1 and the second touch electrode can be spaced apart from each other at a predetermined distance. At least two first touch electrodes TE1 adjacent in the first direction (or X-axis direction) can be formed to be spaced apart from each other. Each of the at least two first touch electrodes TE1 adjacent in the first direction (or X-axis direction) can be connected to the first touch connection electrode BE1 disposed between the respective first touch electrodes TE1. For example, each of the first touch electrodes TE1 can be connected to the first touch connection electrode BE1 through the hole of the touch insulating layer 730.

The second touch electrodes adjacent to each other in the second direction (or Y-axis direction) can be connected by the second touch connection electrode BE2. The second touch electrode and the second touch connection electrode BE2 can be formed on the same layer. For example, the second touch connection electrode BE2 can be disposed between each of the plurality of second touch electrodes while being disposed on the same layer as the second touch electrode. The second touch connection electrode BE2 can extend from the second touch electrode.

The first touch electrode TE1, the second touch electrode, and the second touch connection electrode BE2 can be formed by the same process. The first touch electrode TE1 and the second touch electrode can have a mesh electrode structure. The first touch connection electrode BE1 and the second touch connection electrode BE2 can also have a mesh electrode structure.

A touch planarization layer 750 can be disposed on the first touch electrode TE1, the second touch electrode, and the second touch connection electrode BE2.

The touch planarization layer 750 can be disposed to cover the touch insulating layer 730, the first touch electrode TE1, the second touch electrode, and the second touch connection electrode BE2.

The touch planarization layer 750 can be formed of at least one of organic insulating materials such as BenzoCycloButene BCB, acryl resin, epoxy resin, phenolic resin, polyamide resin, or polyimide resin, but the present disclosure is not limited thereto.

The touch driving circuit can receive the touch sensing signal from the first touch electrode TE1. In addition, the touch driving circuit can transmit the touch driving signal from the second touch electrode. The touch driving circuit can sense a user's touch by using a mutual capacitance between the plurality of first touch electrodes TE1 and the second touch electrode. For example, when a touch operation is performed on the display apparatus 100, a capacitance change can occur between the first touch electrode TE1 and the second touch electrode. The touch driving circuit can detect the touch coordinates by detecting the capacitance change.

Figure 7:
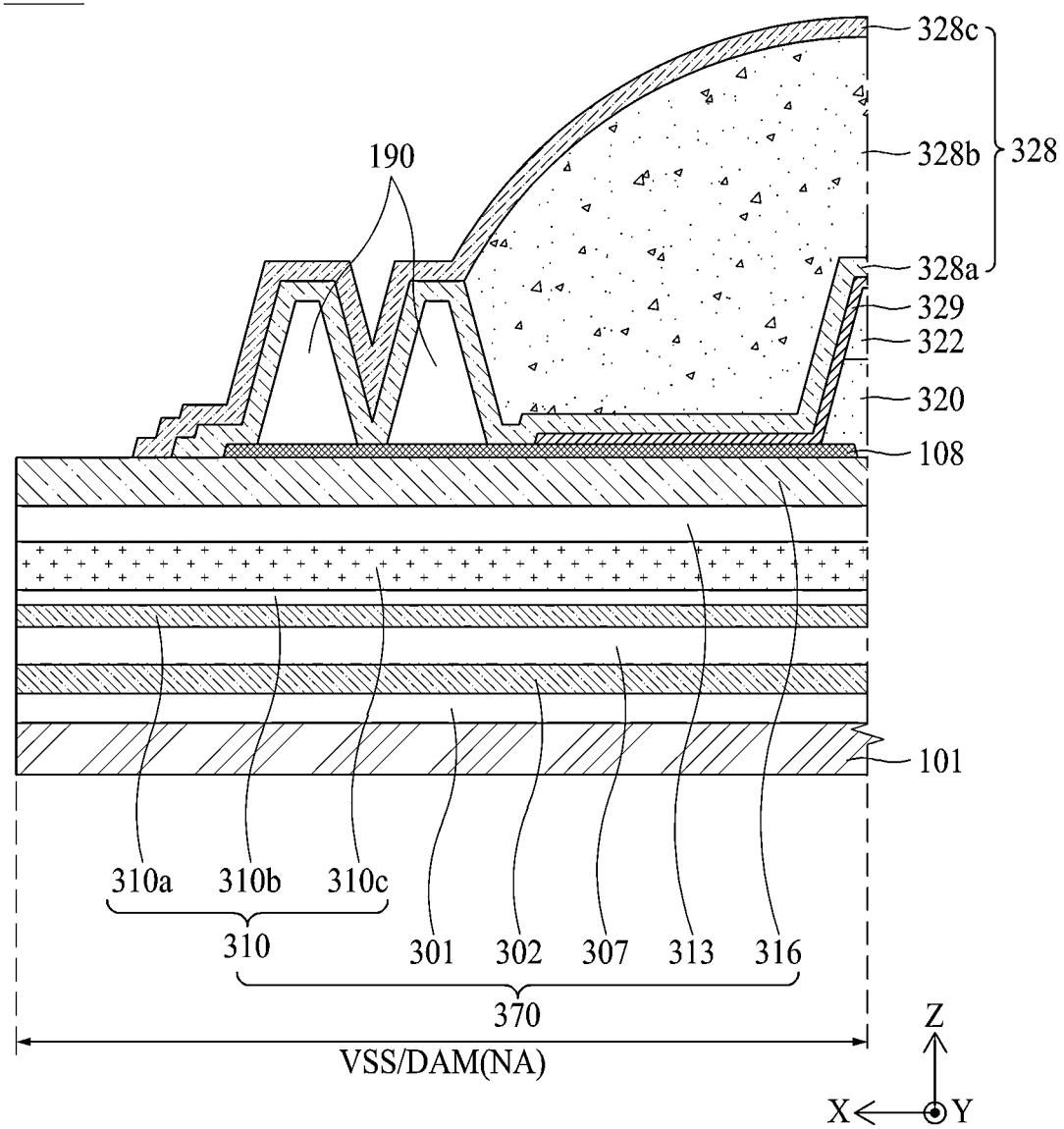
FIG. 7 is a cross-sectional view illustrating a portion of a non-display area of a display apparatus according to one example embodiment of the present disclosure.

FIG. 7 is a cross-sectional view illustrating a portion of a non-display area of an organic light emitting display apparatus according to one example embodiment of the present disclosure.

FIG. 7 illustrates an example of a cross-sectional view taken along II-II' of FIG. 2.

Referring to FIGS. 5 and 7, according to one example embodiment, an encapsulation portion 328 is formed in a three-layered structure of inorganic layer 328a/organic layer 328b/inorganic layer 328c.

A cover glass can be disposed on the encapsulation portion 328 and can be attached by an adhesive layer. The adhesive layer can be any material having strong adhesive properties and superior heat and water resistance. According to one or more example embodiments of the present disclosure, thermosetting resin such as an epoxy-based compound, an acrylate-based compound, or an acrylic rubber can be used. In addition, photocurable resin can be used as an adhesive. In this case, the adhesive layer can be cured by irradiating light such as ultraviolet rays to the adhesive layer.

The adhesive layer not only bonds the substrate 101 and the cover glass but also serves as an encapsulant for preventing moisture from penetrating into the display apparatus.

The cover glass is an encapsulation cap for encapsulating the organic light emitting display apparatus, wherein the cover glass can use a protective film such as a polystyrene film PS, a polyethylene film PE, a polyethylene terephthalate film PEN, a polyimide film PI, or the like, or glass can be used.

As shown in FIG. 2, the non-display area NA can be located outside the display area AA, and the driving circuit (e.g., gate driver 103) and power supply wirings can be disposed therein. In addition, materials used in the configuration of the display area AA can be utilized for different uses or functions in the non-display area NA. For example, metal 108 which is the same as the source/drain electrodes of the display area TFT can be disposed in the VSS/DAM area of the non-display area NA for the power supply wiring or electrode. In addition, metal 329 which is the same as one electrode (for example, anode) of the organic light emitting diode can be arranged in the non-display area NA for the wiring and electrode.

The encapsulation portion 328 covers the upper portion of the organic light emitting element in the display area AA. The encapsulation portion 328 can be formed of an inorganic layer made of glass, metal, aluminum oxide AlOx, or a silicon Si-based material, or can have a structure in which an organic layer and an inorganic layer are alternately stacked. The inorganic layers 328a and 328c serve to block a penetration of moisture or oxygen, and the organic layer 328b serves to planarize a surface of the inorganic layer 328a.

Since the organic layer 328b has a certain degree of flow, the organic layer 328b can flow to the outside of the non-display area NA during a deposition process. A blocking structure (dam) 190 is arranged to control spreading of the organic layer 328b from the non-display area NA. Although two blocking structures 190 are illustrated in FIG. 7, other numbers of blocking structures 190 can be arranged. The blocking structure 190 can be disposed to surround the display area AA or can be disposed in the display area AA. The blocking structure 190 can be formed in multiple layers using at least one material. For example, the blocking structure 190 can be made of a material used to form the first planarization layer 320, the second planarization layer 322, the bank layer 324, and the like.

Various circuits and electrodes/wirings disposed in the non-display area NA can be made of the same material as the gate metal and/or the source/drain metal 108. The source/drain metal 108 is formed of the same material as the source/drain electrode of the TFT by the same process.

For example, the source/drain metal can be used as the power supply wiring 108 (e.g., low-level power supply VSS, high-level power supply VDD). In this example, the power supply wiring 108 is connected to the metal layer 329, and the cathode electrode 327 of the organic light emitting diode can be supplied with power through the connection with the power supply wiring 108 and the metal layer 329. The metal layer 329 is in contact with the power supply wiring 108, and can extend along the outermost sidewalls of the first planarization layer 320 and the second planarization layer 322 to contact the cathode electrode 327 above the first planarization layer 320 and the second planarization layer 322. The metal layer 329 can be the metal layer formed of the same material as the anode electrode 323 of the organic light emitting diode by the same process.

FIGS. 8A to 8C and FIGS. 9A to 9C illustrate other example embodiments of the present disclosure. FIGS. 8A, 8C, 9A, and 9C are examples of cross-sectional views taken along I-I' of FIG. 1.

FIGS. 8A, 8B, 9A, and 9B are configured by changing a positional relationship among a first lower gate electrode, a second lower gate electrode, a plurality of insulating layers, and a plurality of buffer layers in the switching thin film transistor 340 described with reference to FIG. 5. A thickness of the lower insulating layer of the drain junction portion DD can be varied based on the degree of element performance, such as current, threshold voltage Vth, S factor, and other factors, while maintaining reliability within an acceptable range. In the following description, the repetitive description, except for certain description of the first lower gate electrode, the second lower gate electrode, the plurality of insulating layers, the plurality of buffer layers, and the other related elements, may be omitted for brevity.

Figure 8A:
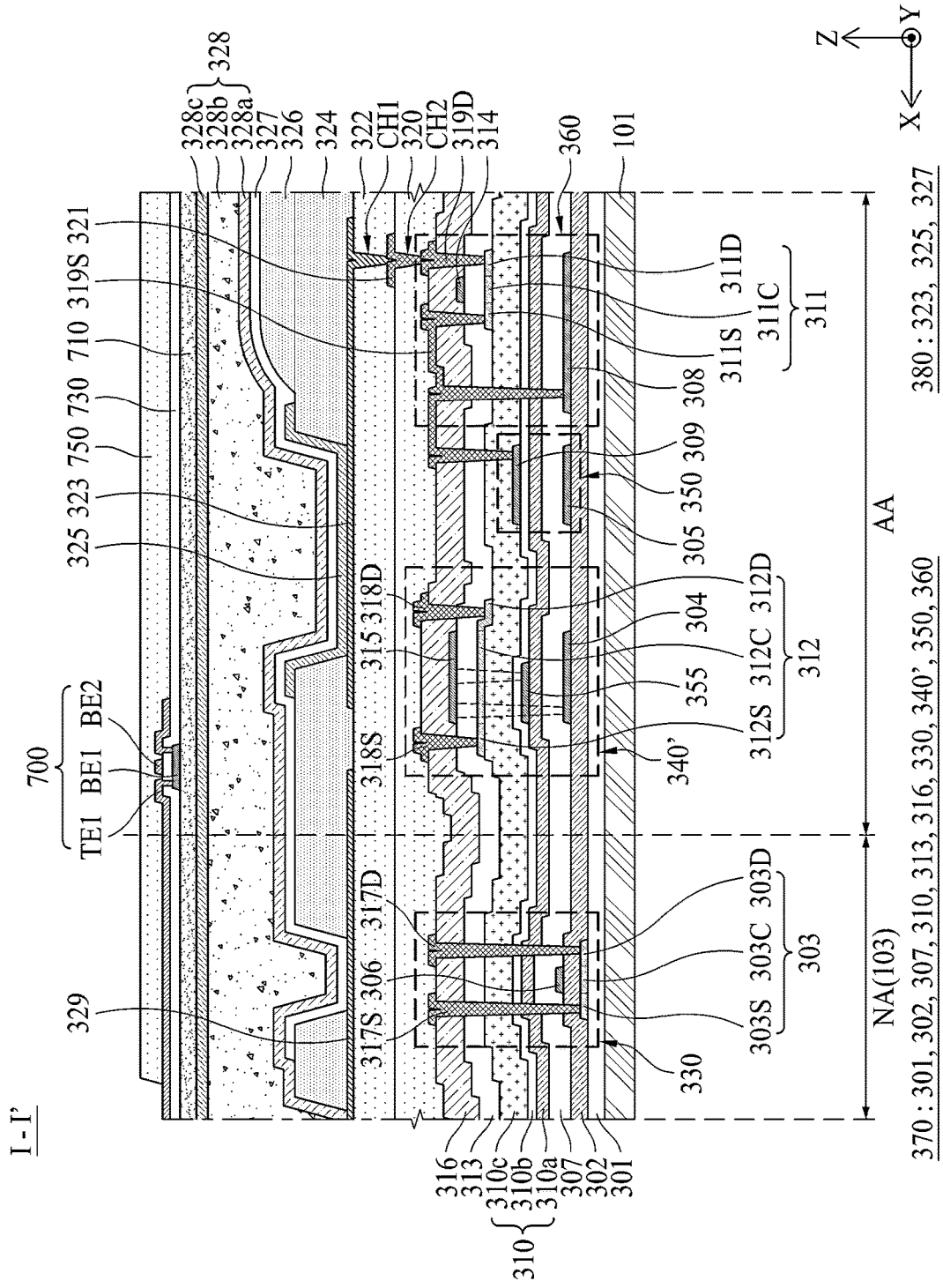
FIG. 8A is a cross-sectional view illustrating a display apparatus according to another example embodiment of the present disclosure.
Figure 8B:
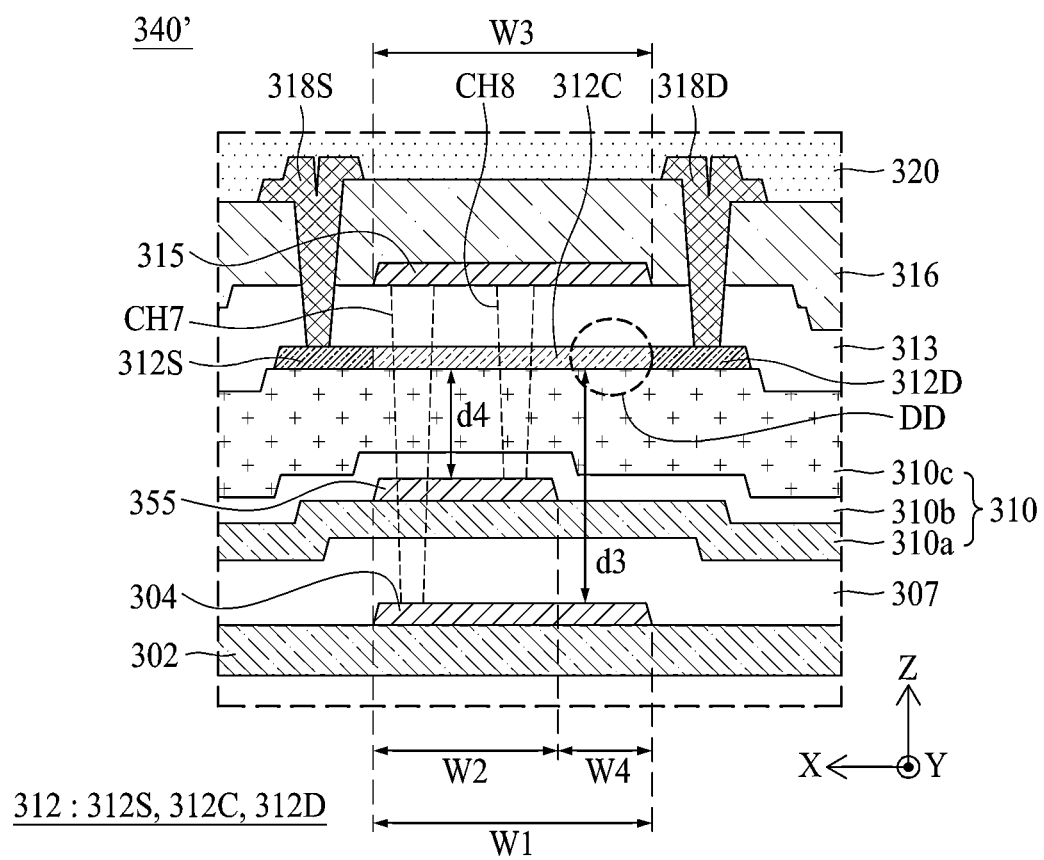
FIG. 8B is an example of an expanded cross-sectional view illustrating a thin film transistor shown in FIG. 8A.

In a switching thin film transistor 340' shown in FIGS. 8A and 8B, a first lower gate electrode 304 can be disposed on a first gate insulating layer 302, and a second lower gate electrode 355 can be disposed on a first sub-buffer layer 310a among a plurality of sub-buffer layers 310a, 310b, and 310c included in an upper buffer layer 310.

In FIGS. 8A and 8B, as compared with FIG. 5, a distance "d4" from a channel region 312C of a second active layer 312 to the second lower gate electrode 355 is small; hence, a distance "d" decreases in an equation E=V/d, whereby more current can flow from a source region 312S to a drain region 312D. The first lower gate electrode 304 is additionally disposed under the second lower gate electrode 355. A distance "d3" from the channel region 312C to the first lower gate electrode 304 is greater (or longer) than the distance "d4" from the channel region 312C to the second lower gate electrode 355. A width W2 of the second lower gate electrode 355 can be smaller (or narrower) than a width W3 of the upper gate electrode 315 and a width W1 of the first lower gate electrode 304. A region W4, where a difference in the width W2 of the second lower gate electrode 355 is illustrated as compared to the width W3 of the upper gate electrode 315 and the width W1 of the first lower gate electrode 304, can be closer to the drain region 312D than the source region 312S. Accordingly, it is possible to prevent deterioration of the drain junction portion DD by reducing charges collected in the drain junction portion DD.

Figure 9A:
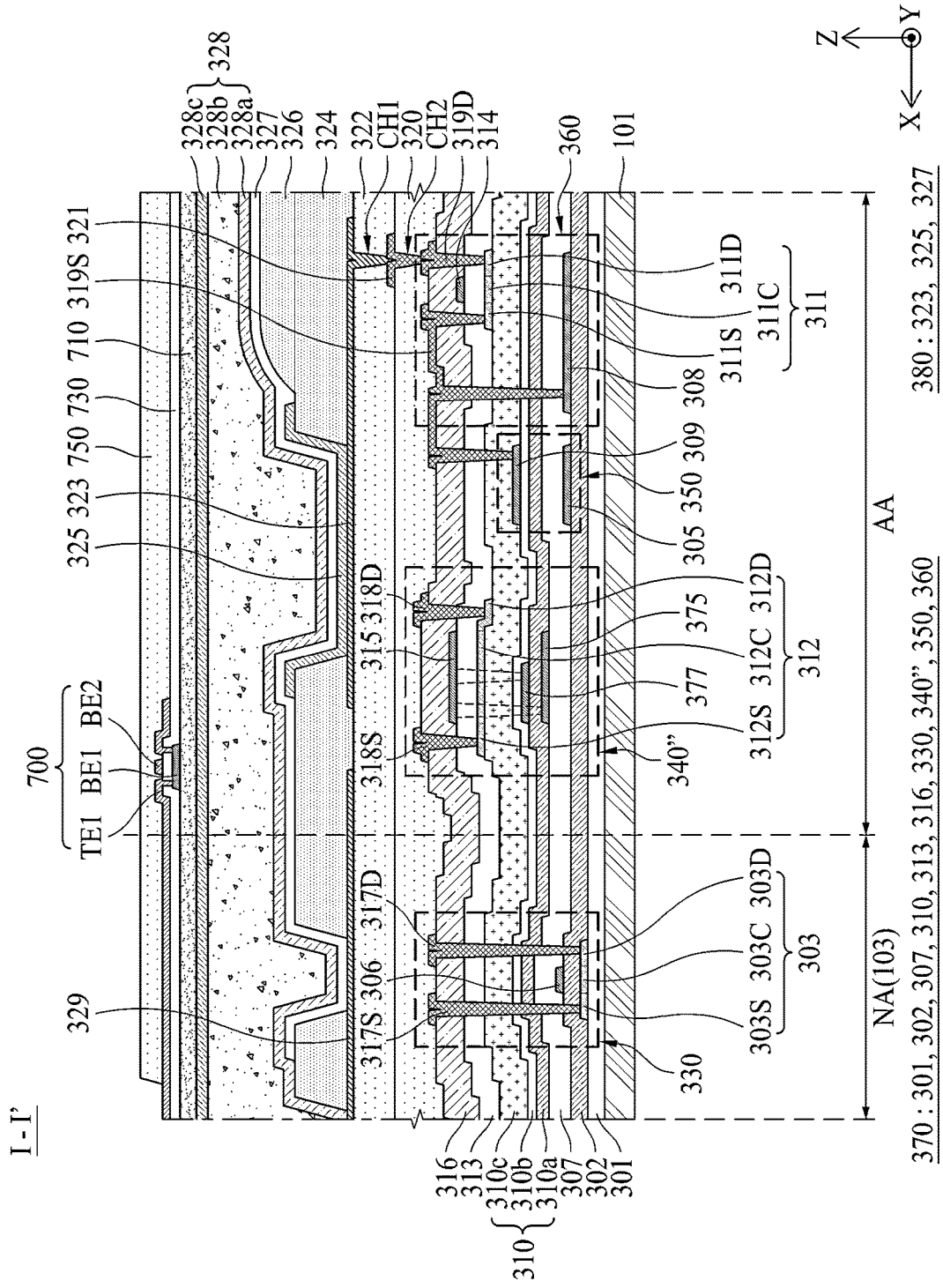
FIG. 9A is a cross-sectional view illustrating a display apparatus according to another example embodiment of the present disclosure.
Figure 9B:
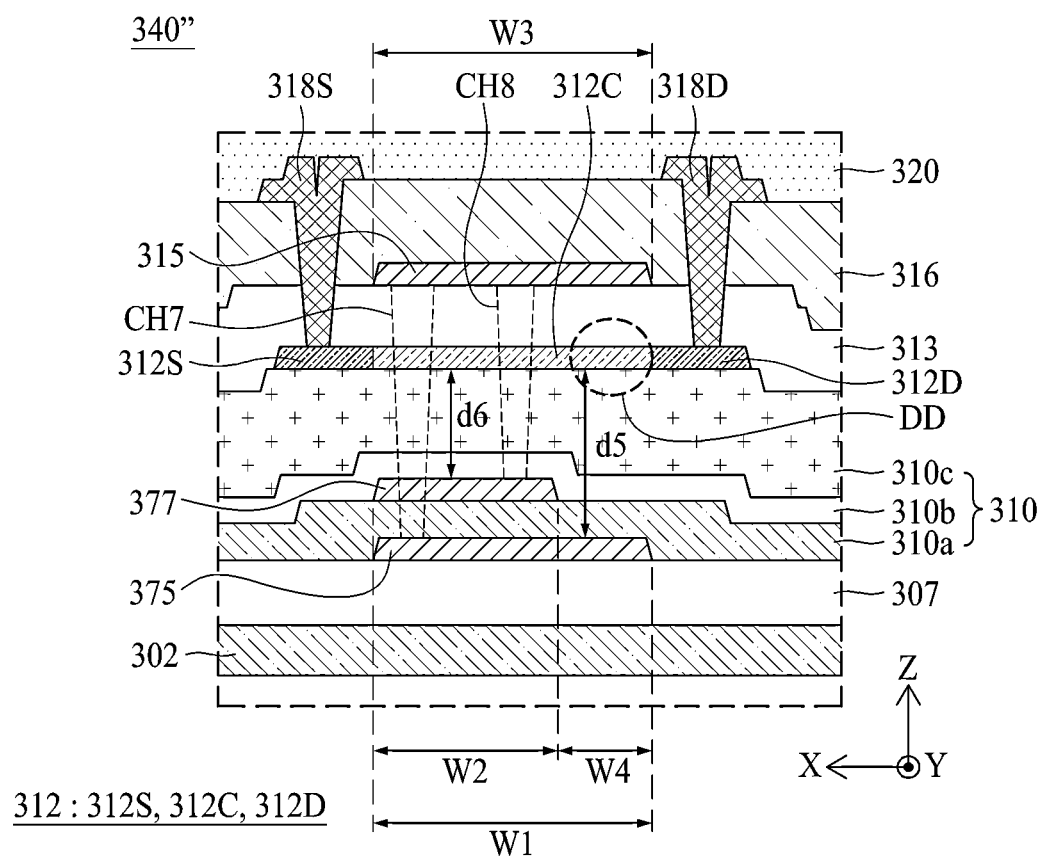
FIG. 9B is an example of an expanded cross-sectional view illustrating a thin film transistor shown in FIG. 9A.

In a switching thin film transistor 340" shown in FIGS. 9A and 9B, a first lower gate electrode 375 can be disposed on a first insulating interlayer 307, and a second lower gate electrode 377 can be disposed on a first sub-buffer layer 310a among a plurality of sub-buffer layers 310a, 310b, and 310c included in an upper buffer layer 310.

In FIGS. 9A and 9B, as compared with FIG. 5, a distance "d6" from a channel region 312C of a second active layer 312 to the second lower gate electrode 377 is small; hence, a distance "d" decreases in an equation E=V/d, whereby more current can flow from a source region 312S to a drain region 312D. The first lower gate electrode 375 is additionally disposed under the second lower gate electrode 377. A distance "d5" from the channel region 312C to the first lower gate electrode 375 is greater (or longer) than the distance "d6" from the channel region 312C to the second lower gate electrode 377. A width W2 of the second lower gate electrode 377 can be smaller (or narrower) than a width W3 of the upper gate electrode 315 and a width W1 of the first lower gate electrode 375. A region W4, where a difference in the width W2 of the second lower gate electrode 377 is illustrated as compared to the width W3 of the upper gate electrode 315 and the width W1 of the first lower gate electrode 375, can be closer to the drain region 312D than the source region 312S. Accordingly, it is possible to prevent deterioration of the drain junction portion DD by reducing charges collected in the drain junction portion DD.

According to one or more example embodiments of the present disclosure, at least some of the configurations included in the plurality of insulating layers and the plurality of buffer layers can be omitted or other components can be added. In addition, a positional relationship between the first lower gate electrode and the second lower gate electrode between the plurality of insulating layers or the buffer layer can be different.

Figure 8C:
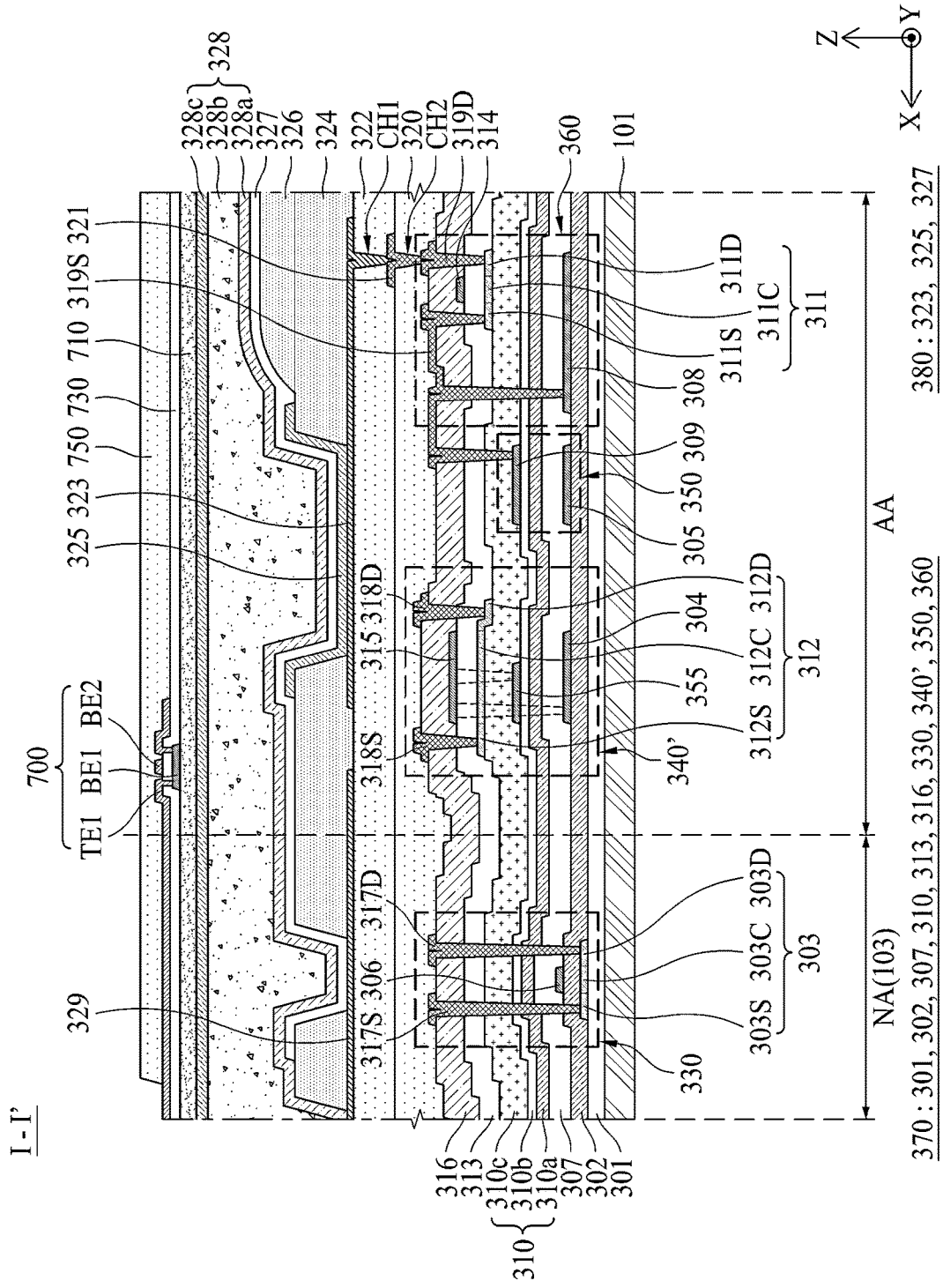
FIG. 8C is a cross-sectional view illustrating a display apparatus according to another example embodiment of the present disclosure.
Figure 9C:
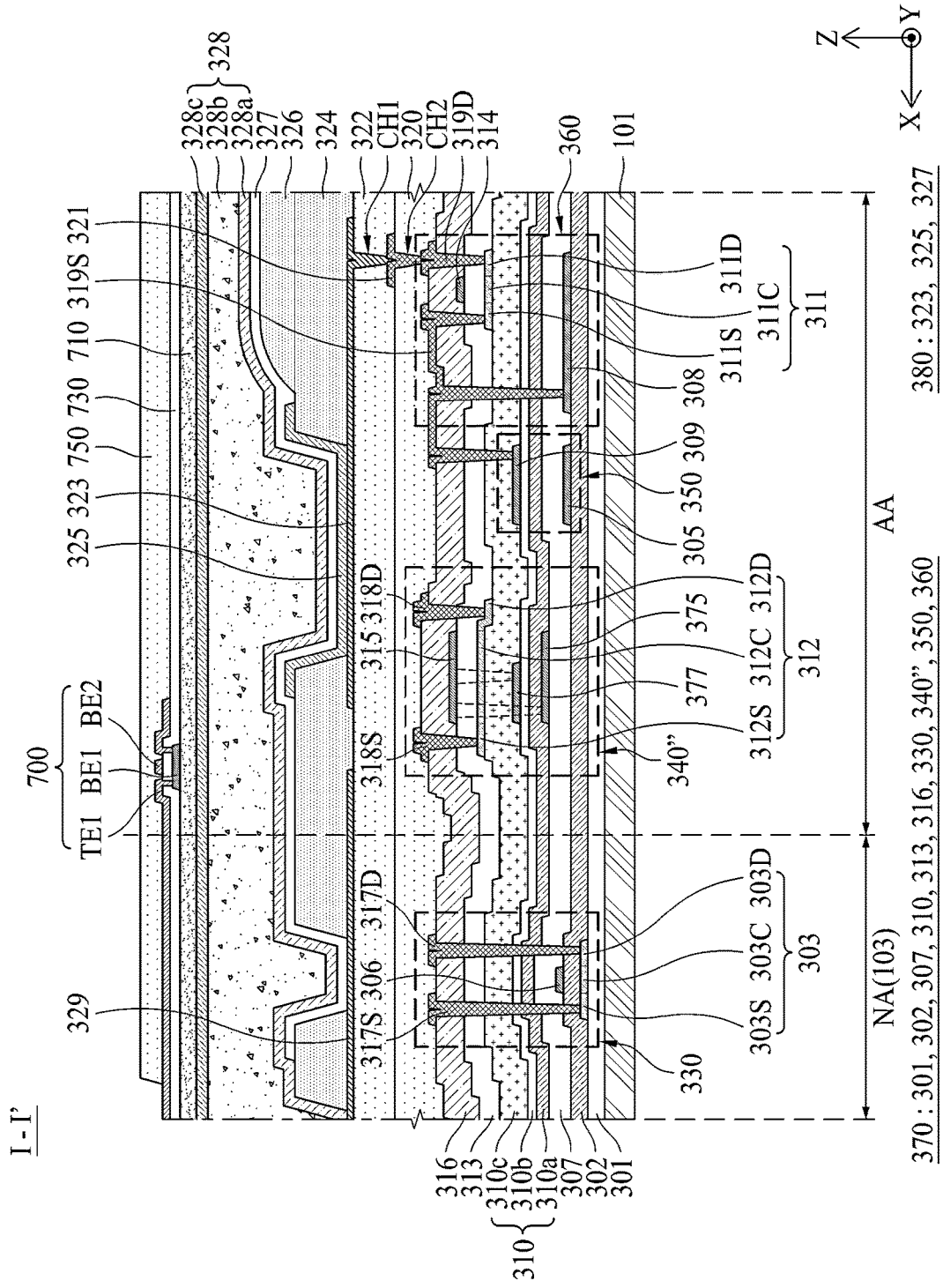
FIG. 9C is a cross-sectional view illustrating a display apparatus according to another example embodiment of the present disclosure.

For example, FIGS. 8C and 9C illustrate other example embodiments of the present disclosure. FIG. 8C is an example of a cross-sectional view taken along line I-I' of FIG. 1.

In FIGS. 8C and 9C, as compared to FIGS. 8A and 9A, the repetitive description, except for certain description of the first lower gate electrode, the second lower gate electrode, the plurality of insulating layers, the plurality of buffer layers, and the other related elements, may be omitted for brevity.

In FIG. 8C, the second lower gate electrode 355 can be disposed on the same layer as the second storage electrode 309, for example, the second sub-buffer layer 310b. Since the same electrode is used by the same mask, a manufacturing process can be simplified, and a manufacturing cost can be reduced by using one mask process.

Similarly, in FIG. 9C, the second lower gate electrode 377 can be disposed on the same layer as the second storage electrode 309, for example, the second sub-buffer layer 310b. Since the same electrode is used using the same mask, a mask process and a cost can be reduced by forming through one mask process. Since the same electrode is used by the same mask, a manufacturing process can be simplified, and a manufacturing cost can be reduced by using one mask process.

A thin film transistor and a display apparatus according to one or more example embodiments of the present disclosure are described below as follows.

A thin film transistor according to one or more example embodiments of the present disclosure can comprise a semiconductor layer, an upper gate electrode overlapped with the semiconductor layer, an upper gate insulating layer disposed between the semiconductor layer and the upper gate electrode, a first lower gate electrode overlapped with the semiconductor layer, a second lower gate electrode disposed between the semiconductor layer and the first lower gate electrode, overlapped with the semiconductor layer, and configured to have a width smaller than that of the upper gate electrode, a first lower insulating layer disposed between the first lower gate electrode and the second lower gate electrode, and a second lower insulating layer disposed between the second lower gate electrode and the semiconductor layer.

According to one or more example embodiments of the present disclosure, the thin film transistor can further include an insulating interlayer disposed on the upper gate electrode, a source electrode disposed on the insulating interlayer and connected to a source region of the semiconductor layer through a first contact hole passing through the insulating interlayer and the upper gate insulating layer, and a drain electrode disposed on the insulating interlayer and connected to a drain region of the semiconductor layer through a second contact hole passing through the insulating interlayer and the upper gate insulating layer.

According to one or more example embodiments of the present disclosure, a region, where a width difference between the upper gate electrode and the second lower gate electrode occurs, can be closer to the drain region than the source region.

According to one or more example embodiments of the present disclosure, an overlapping width between the second lower gate electrode and a channel region of the semiconductor layer can be smaller than an overlapping width between the first lower gate electrode and the channel region of the semiconductor layer.

According to one or more example embodiments of the present disclosure, a region, where a width difference between the second lower gate electrode and the first lower gate electrode occurs, can be closer to the drain region than the source region.

According to one or more example embodiments of the present disclosure, a distance between the second lower gate electrode and the semiconductor layer can be smaller than a distance between the first lower gate electrode and the semiconductor layer.

According to one or more example embodiments of the present disclosure, the transistor can include an oxide semiconductor layer.

According to one or more example embodiments of the present disclosure, the first lower insulating layer can include at least one insulating layer among a plurality of insulating layers.

According to one or more example embodiments of the present disclosure, the second lower insulating layer can include at least one insulating layer among a plurality of insulating layers.

According to one or more example embodiments of the present disclosure, a display apparatus can include a plurality of pixels, each including a thin film transistor, wherein the thin film transistor includes a semiconductor layer, an upper gate electrode insulated from the semiconductor layer and overlapped with the semiconductor layer, a first lower gate electrode insulated from the semiconductor layer and overlapped with the semiconductor layer, and a second lower gate electrode disposed between the semiconductor layer and the first lower gate electrode, insulated from the semiconductor layer and overlapped the semiconductor layer, wherein an overlapping width between a channel region of the semiconductor layer and the second lower gate electrode is smaller than an overlapping width between the channel region of the semiconductor layer and the upper gate electrode.

According to one or more example embodiments of the present disclosure, the thin film transistor can further include an insulating interlayer disposed on the upper gate electrode, an upper gate insulating layer disposed under the upper gate electrode, a source electrode disposed on the insulating interlayer and connected to a source region of the semiconductor layer through a first contact hole passing through the insulating interlayer and the upper gate insulating layer, and a drain electrode disposed on the insulating interlayer and connected to a drain region of the semiconductor layer through a second contact hole passing through the insulating interlayer and the upper gate insulating layer.

According to one or more example embodiments of the present disclosure, a region, where a width difference between the upper gate electrode and the second lower gate electrode occurs, can be closer to the drain region than the source region.

According to one or more example embodiments of the present disclosure, a width of the second lower gate electrode can be smaller than a width of the first lower gate electrode.

According to one or more example embodiments of the present disclosure, a region, where a width difference between the second lower gate electrode and the first lower gate electrode occurs, can be closer to the drain region than the source region.

According to one or more example embodiments of the present disclosure, a distance between the second lower gate electrode and the semiconductor layer can be smaller than a distance between the first lower gate electrode and the semiconductor layer.

According to one or more example embodiments of the present disclosure, the transistor can include an oxide semiconductor layer.

According to one or more example embodiments of the present disclosure, a display apparatus can include a substrate, a display area, a non-display area outside of the display area, and a plurality of pixels disposed on a substrate and configured to include a first transistor, a second transistor, and an emission element disposed on the first transistor and the second transistor. The first transistor can include a first semiconductor layer disposed on an upper buffer layer, an upper gate electrode overlapped with the first semiconductor layer with an upper gate insulating layer interposed therebetween, a first lower gate electrode overlapped with the first semiconductor layer, and a second lower gate electrode overlapped with the first semiconductor layer. At least one sub-buffer layer of the upper buffer layer can include a plurality of sub-buffer layers interposed therebetween. The second lower gate electrode can have a width smaller than a width of the upper gate electrode. The first lower gate electrode can be disposed under the second lower gate electrode. The first transistor can further include a first insulating interlayer disposed on or under the first lower gate electrode, a second insulating interlayer covering the upper gate electrode, a lower gate insulating layer disposed under the first lower gate electrode, and a source electrode and a drain electrode disposed on the second insulating interlayer and connected to the first semiconductor layer through respective first and second contact holes passing through the second insulating interlayer and the upper gate insulating layer.

According to one or more example embodiments of the present disclosure, the second transistor can include a second semiconductor layer disposed on the upper buffer layer, a second gate electrode overlapped with the second semiconductor layer with the upper gate insulating layer interposed therebetween, and a second source electrode and a second drain electrode disposed on the second insulating interlayer and connected to the second semiconductor layer through respective third and fourth contact holes passing through the second insulating interlayer and the upper gate insulating layer.

According to one or more example embodiments of the present disclosure, the upper buffer layer can include a plurality of sub-buffer layers including a first sub-buffer layer, a second sub-buffer layer, and a third sub-buffer layer. The third sub-buffer layer can be disposed under the first semiconductor layer. The second sub-buffer layer can be disposed under the third sub-buffer layer. The first sub-buffer layer can be disposed under the second sub-buffer layer.

According to one or more example embodiments of the present disclosure, the display apparatus can further include a gate driving circuit disposed in a non-display area, wherein each of a plurality of thin film transistors included in the gate driving circuit includes a polycrystalline semiconductor layer disposed on the substrate, a third gate electrode overlapped with the polycrystalline semiconductor layer with the lower gate insulating layer interposed therebetween, the first insulating interlayer disposed on the third gate electrode, the upper buffer layer, the upper gate insulating layer, and the second insulating interlayer stacked on the first insulating interlayer, and a third source electrode and a third drain electrode connected to the polycrystalline semiconductor layer through respective fifth and sixth contact holes passing through the second insulating interlayer, the upper gate insulating layer, the upper buffer layer, the first insulating interlayer, and the lower gate insulating layer.

According to one or more example embodiments of the present disclosure, the first lower gate electrode can be disposed on the lower gate insulating layer, the second lower gate electrode can be disposed on the first insulating interlayer, the upper buffer layer can be disposed between the first semiconductor layer and the second lower gate electrode, and the first insulating interlayer can be disposed between the second lower gate electrode and the first lower gate electrode.

According to one or more example embodiments of the present disclosure, the first lower gate electrode can be disposed on the lower gate insulating layer, the second lower gate electrode can be disposed on the first sub-buffer layer among the plurality of sub-buffer layers included in the upper buffer layer, at least one of the plurality of sub-buffer layers can be disposed between the first semiconductor layer and the second lower gate electrode, and at least one of the plurality of sub-buffer layers and the first insulating interlayer can be disposed between the second lower gate electrode and the first lower gate electrode.

According to one or more example embodiments of the present disclosure, the first lower gate electrode can be disposed on the lower gate insulating layer, the second lower gate electrode can be disposed on the second sub-buffer layer among the plurality of sub-buffer layers included in the upper buffer layer, the third sub-buffer layer of the plurality of sub-buffer layers can be disposed between the first semiconductor layer and the second lower gate electrode, and the second sub-buffer layer, the first sub-buffer layer and the first insulating interlayer can be disposed between the second lower gate electrode and the first lower gate electrode.

According to one or more example embodiments of the present disclosure, the first lower gate electrode can be disposed on the first insulating interlayer, the second lower gate electrode can be disposed on the first sub-buffer layer among the plurality of sub-buffer layers included in the upper buffer layer, the second and third sub-buffer layers of the upper buffer layer can be disposed between the first semiconductor layer and the second lower gate electrode, and the first sub-buffer layer can be disposed between the second lower gate electrode and the first lower gate electrode.

According to one or more example embodiments of the present disclosure, the first lower gate electrode can be disposed on the first insulating interlayer, the second lower gate electrode can be disposed on the second sub-buffer layer among the plurality of sub-buffer layers included in the upper buffer layer, the third sub-buffer layer of the upper buffer layer can be disposed between the first semiconductor layer and the second lower gate electrode, and the second and first sub-buffer layers can be disposed between the second lower gate electrode and the first lower gate electrode.

According to one or more example embodiments of the present disclosure, the display apparatus can further include a power line disposed in a non-display area, a blocking structure disposed in the non-display area, and a gate driving circuit disposed in the non-display area.

According to one or more example embodiments of the present disclosure, the display apparatus can further include an encapsulation portion for covering the plurality of pixels on the substrate, a touch sensor layer disposed on the encapsulation portion, and a touch buffer layer disposed between the encapsulation portion and the touch sensor layer.

According to one or more example embodiments of the present disclosure, the touch sensor layer can include a first touch connection electrode, a touch insulating layer disposed on the first touch connection electrode, and a first touch electrode and a second touch electrode disposed on the touch insulating layer.

According to one or more example embodiments of the present disclosure, the source electrode, the drain electrode, the third source electrode and the third drain electrode can be formed of a same material simultaneously.

According to one or more example embodiments of the present disclosure, the first semiconductor layer can include oxide semiconductor, and the second semiconductor layer can include oxide semiconductor.

The thin film transistor and the display apparatus according to one or more example embodiments of the present disclosure can be configured to have the thin film transistor including the oxide semiconductor pattern so that it is possible to reduce the leakage current in the turn-off state, to thereby lower power consumption. In addition, as the parasitic capacitance can be controlled by the oxide semiconductor pattern, the effective voltage applied to the oxide semiconductor pattern can be reduced. Thus, defects such as stains and the like can be overcome through precise gradation representation at the low grayscale.

Furthermore, the thin film transistor and the display apparatus according to one or more example embodiments of the present disclosure can be configured to include the lower gate disposed under the switching thin film transistor, wherein the width of the lower gate is relatively smaller than the width of the upper gate, whereby the insulating layer disposed under the channel region close to the drain region is increased in its thickness. Accordingly, it is possible to prevent charges from being overheated during the driving time, to thereby prevent degradation of reliability.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor, comprising:
a semiconductor layer;
an upper gate electrode overlapped with the semiconductor layer;
an upper gate insulating layer disposed between the semiconductor layer and the upper gate electrode;
a first lower gate electrode overlapped with the semiconductor layer;
a second lower gate electrode disposed between the semiconductor layer and the first lower gate electrode, overlapped with the semiconductor layer, and configured to have a width smaller than a width of the upper gate electrode;
a first lower insulating layer disposed between the first lower gate electrode and the second lower gate electrode; and
a second lower insulating layer disposed between the second lower gate electrode and the semiconductor layer,
wherein the upper gate electrode is electrically connected with the first lower gate electrode and the second lower gate electrode.

2. The thin film transistor according to claim 1, further comprising:
an insulating interlayer disposed on the upper gate electrode;
a source electrode disposed on the insulating interlayer and connected to a source region of the semiconductor layer through a first contact hole passing through the insulating interlayer and the upper gate insulating layer; and
a drain electrode disposed on the insulating interlayer and connected to a drain region of the semiconductor layer through a second contact hole passing through the insulating interlayer and the upper gate insulating layer.

3. The thin film transistor according to claim 2, wherein a region, where a width difference between the upper gate electrode and the second lower gate electrode occurs, is closer to the drain region than the source region.

4. The thin film transistor according to claim 2, wherein an overlapping width between the second lower gate electrode and a channel region of the semiconductor layer is smaller than an overlapping width between the first lower gate electrode and the channel region of the semiconductor layer.

5. The thin film transistor according to claim 4, wherein a region, where a width difference between the second lower gate electrode and the first lower gate electrode occurs, is closer to the drain region than the source region.

6. The thin film transistor according to claim 1, wherein a distance between the second lower gate electrode and the semiconductor layer is smaller than a distance between the first lower gate electrode and the semiconductor layer.

7. The thin film transistor according to claim 1, wherein the semiconductor layer includes an oxide semiconductor layer.

8. The thin film transistor according to claim 1, wherein the first lower insulating layer includes at least one insulating layer.

9. The thin film transistor according to claim 1, wherein the second lower insulating layer includes at least one insulating layer.

10. The thin film transistor according to claim 1, wherein the width of the second lower gate electrode overlapped with the semiconductor layer is smaller than a length of a channel region of the semiconductor layer.

11. A display apparatus, comprising:
a display area including a plurality of pixels, each including a thin film transistor and a light emission element on the thin film transistor; and
a non-display area including a gate driving circuit outside of the display area,
wherein the thin film transistor includes:
a semiconductor layer;
an upper gate electrode insulated from the semiconductor layer and overlapped with the semiconductor layer;
a first lower gate electrode insulated from the semiconductor layer and overlapped with the semiconductor layer; and
a second lower gate electrode disposed between the semiconductor layer and the first lower gate electrode, insulated from the semiconductor layer and overlapped the semiconductor layer, wherein an overlapping width between a channel region of the semiconductor layer and the second lower gate electrode is smaller than an overlapping width between the channel region of the semiconductor layer and the upper gate electrode, and wherein the display apparatus further comprises:

an encapsulation portion disposed on the display area and the non-display area to cover the plurality of pixels and the gate driving circuit, wherein the encapsulation portion includes a first inorganic encapsulation layer, a second inorganic encapsulation layer, and an organic encapsulation layer between the first and second inorganic encapsulation layers;

a touch buffer layer disposed on the second inorganic encapsulation layer, wherein the touch buffer layer overlaps the gate driving circuit in the non-display area; and a touch sensor layer disposed on the touch buffer layer.

12. The display apparatus according to claim 11, wherein the thin film transistor further includes:

an insulating interlayer disposed on the upper gate electrode;

an upper gate insulating layer disposed under the upper gate electrode;

a source electrode disposed on the insulating interlayer and connected to a source region of the semiconductor layer through a first contact hole passing through the insulating interlayer and the upper gate insulating layer; and a drain electrode disposed on the insulating interlayer and connected to a drain region of the semiconductor layer through a second contact hole passing through the insulating interlayer and the upper gate insulating layer.

13. The display apparatus according to claim 12, wherein a region, where a width difference between the upper gate electrode and the second lower gate electrode occurs, is closer to the drain region than the source region.

14. The display apparatus according to claim 12, wherein a width of the second lower gate electrode is smaller than a width of the first lower gate electrode.

15. The display apparatus according to claim 14, wherein a region, where a width difference between the second lower gate electrode and the first lower gate electrode occurs, is closer to the drain region than the source region.

16. The display apparatus according to claim 11, wherein a distance between the second lower gate electrode and the semiconductor layer is smaller than a distance between the first lower gate electrode and the semiconductor layer.

17. The display apparatus according to claim 11, wherein the semiconductor layer includes an oxide semiconductor layer.

18. The display apparatus according to claim 11, wherein the width of the second lower gate electrode overlapped with the semiconductor layer is smaller than a length of a channel region of the semiconductor layer.

19. The display apparatus according to claim 11, wherein the upper gate electrode is electrically connected with the first lower gate electrode and the second lower gate electrode.

20. The display apparatus according to claim 11, further comprising:

a touch planarization layer disposed on the touch sensor layer, wherein the touch sensor layer includes a touch electrode and a touch routing line connected with the touch electrode, and wherein the touch routing line and the touch planarization layer overlaps the gate driving circuit in the non-display area.

21. The display apparatus according to claim 11, further comprising:

a power supply line disposed in the non-display area;

a metal layer disposed in the non-display area;

a first contact portion configured to connect the metal layer and a cathode electrode of the light emission element in the non-display area; and a second contact portion configured to connect the power supply line and metal layer in the non-display area.

22. The display apparatus according to claim 21, wherein the first contact portion is disposed on the gate driving circuit in the non-display area, and wherein the metal layer is formed of a same material as an anode electrode of the light emission element and is disposed on a same layer as the anode electrode.

23. The display apparatus according to claim 21, further comprising:

a first planarization layer and a second planarization layer disposed between the thin film transistor and the light emission element, and a blocking structure disposed in the non-display area, wherein the metal layer is extended along outermost sidewalls of the first planarization layer and the second planarization layer to contact the power supply line inside the blocking structure in the non-display area.

24. The display apparatus according to claim 21, further comprising:

wherein the power supply line is formed of a same material as a source electrode and a drain electrode of the thin film transistor and is disposed on a same layer as the source electrode and the drain electrode.

25. A display apparatus, comprising:

a substrate;

a display area;

a non-display area outside of the display area;

a plurality of pixels disposed on the substrate of the display area and configured to include a first transistor, a second transistor, and a light emission element disposed on the first transistor and the second transistor; and a gate driving circuit disposed on the substrate of the non-display area, wherein the first transistor includes:

a first semiconductor layer disposed on an upper buffer layer;

an upper gate electrode overlapped with the first semiconductor layer with an upper gate insulating layer interposed between the upper gate electrode and the first semiconductor layer;

a first lower gate electrode overlapped with the first semiconductor layer;

a second lower gate electrode overlapped with the first semiconductor layer, wherein at least one sub-buffer layer of the upper buffer layer includes sub-buffer layers interposed between the second lower gate electrode and the first semiconductor layer, wherein the second lower gate electrode is configured to have a width smaller than a width of the upper gate electrode, and wherein the first lower gate electrode is disposed under the second lower gate electrode;

a first insulating interlayer disposed on or under the first lower gate electrode;

a second insulating interlayer covering the upper gate electrode;

a lower gate insulating layer disposed under the first lower gate electrode; and a source electrode and a drain electrode disposed on the second insulating interlayer and connected to the first semiconductor layer through respective first and second contact holes passing through the second insulating interlayer and the upper gate insulating layer, and wherein the display apparatus further comprises:

an encapsulation portion disposed on the display area and the non-display area to cover the plurality of pixels and the gate driving circuit, wherein the encapsulation portion includes a first inorganic encapsulation layer, a second inorganic encapsulation layer, and an organic encapsulation layer between the first and second inorganic encapsulation layers;

a touch buffer layer disposed on the second inorganic encapsulation layer, wherein the touch buffer layer overlaps the gate driving circuit in the non-display area; and a touch sensor layer disposed on the touch buffer layer.

26. The display apparatus according to claim 25, wherein the second transistor includes:

a second semiconductor layer disposed on the upper buffer layer;

a second gate electrode overlapped with the second semiconductor layer with the upper gate insulating layer interposed between the second gate electrode and the second semiconductor layer; and a second source electrode and a second drain electrode disposed on the second insulating interlayer and connected to the second semiconductor layer through respective third and fourth contact holes passing through the second insulating interlayer and the upper gate insulating layer.

27. The display apparatus according to claim 25, wherein:

the upper buffer layer includes a plurality of sub-buffer layers including a first sub-buffer layer, a second sub-buffer layer, and a third sub-buffer layer;

the third sub-buffer layer is disposed under the first semiconductor layer;

the second sub-buffer layer is disposed under the third sub-buffer layer; and the first sub-buffer layer is disposed under the second sub-buffer layer.

28. The display apparatus according to claim 25, wherein each of a plurality of thin film transistors included in the gate driving circuit includes:

a polycrystalline semiconductor layer disposed on the substrate;

a third gate electrode overlapped with the polycrystalline semiconductor layer with the lower gate insulating layer interposed between the third gate electrode and the polycrystalline semiconductor layer;

the first insulating interlayer disposed on the third gate electrode;

the upper buffer layer, the upper gate insulating layer, and the second insulating interlayer stacked on the first insulating interlayer; and a third source electrode and a third drain electrode connected to the polycrystalline semiconductor layer through respective fifth and sixth contact holes passing through the second insulating interlayer, the upper gate insulating layer, the upper buffer layer, the first insulating interlayer, and the lower gate insulating layer.

29. The display apparatus according to claim 25, wherein the first lower gate electrode is disposed directly on the lower gate insulating layer, the second lower gate electrode is disposed on the first insulating interlayer, the upper buffer layer is disposed between the first semiconductor layer and the second lower gate electrode, and the first insulating interlayer is disposed between the second lower gate electrode and the first lower gate electrode.

30. The display apparatus according to claim 27, wherein the first lower gate electrode is directly disposed on the lower gate insulating layer, the second lower gate electrode is disposed on the first sub-buffer layer among the plurality of sub-buffer layers included in the upper buffer layer, at least one of the plurality of sub-buffer layers is disposed between the first semiconductor layer and the second lower gate electrode, and at least one of the plurality of sub-buffer layers and the first insulating interlayer are disposed between the second lower gate electrode and the first lower gate electrode.

31. The display apparatus according to claim 27, wherein the first lower gate electrode is directly disposed on the lower gate insulating layer, the second lower gate electrode is disposed on the second sub-buffer layer among the plurality of sub-buffer layers included in the upper buffer layer, the third sub-buffer layer of the plurality of sub-buffer layers is disposed between the first semiconductor layer and the second lower gate electrode, and the second sub-buffer layer, the first sub-buffer layer and the first insulating interlayer are disposed between the second lower gate electrode and the first lower gate electrode.

32. The display apparatus according to claim 27, wherein the first lower gate electrode is disposed on the first insulating interlayer, the second lower gate electrode is disposed on the first sub-buffer layer among the plurality of sub-buffer layers included in the upper buffer layer, the second and third sub-buffer layers of the upper buffer layer are disposed between the first semiconductor layer and the second lower gate electrode, and the first sub-buffer layer is disposed between the second lower gate electrode and the first lower gate electrode.

33. The display apparatus according to claim 27, wherein the first lower gate electrode is disposed on the first insulating interlayer, the second lower gate electrode is disposed on the second sub-buffer layer among the plurality of sub-buffer layers included in the upper buffer layer, the third sub-buffer layer of the upper buffer layer is disposed between the first semiconductor layer and the second lower gate electrode, and the second and first sub-buffer layers are disposed between the second lower gate electrode and the first lower gate electrode.

34. The display apparatus according to claim 25, further comprising:

a power line disposed in the non-display area; and a blocking structure disposed in the non-display area.

35. The display apparatus according to claim 25, wherein the touch sensor layer includes a first touch connection electrode on the touch buffer layer, a touch insulating layer disposed on the touch buffer layer to cover the first touch connection electrode, and a first touch electrode and a second touch electrode disposed on the touch insulating layer.

36. The display apparatus according to claim 28, wherein the source electrode, the drain electrode, the third source electrode and the third drain electrode are formed of a same material simultaneously.

37. The display apparatus according to claim 26, wherein the first semiconductor layer includes oxide semiconductor, and the second semiconductor layer includes oxide semiconductor.

38. The display apparatus according to claim 25, wherein the width of the second lower gate electrode overlapped with the first semiconductor layer is smaller than a length of a channel region of the first semiconductor layer.

39. The display apparatus according to claim 25, wherein the upper gate electrode is electrically connected with the first lower gate electrode and the second lower gate electrode.

40. The display apparatus according to claim 25, further comprising:
    a touch planarization layer disposed on the touch sensor layer,
    wherein the touch sensor layer includes a touch electrode and a touch routing line connected with the touch electrode, and
    wherein the touch routing line and the touch planarization layer overlaps the gate driving circuit in the non-display area.

41. The display apparatus according to claim 25, further comprising:
    a power supply line disposed in the non-display area;
    a metal layer disposed in the non-display area;
    a first contact portion configured to connect the metal layer and a cathode electrode of the light emission element in the non-display area; and
    a second contact portion configured to connect the power supply line and metal layer in the non-display area.

42. The display apparatus according to claim 41,
    wherein the first contact portion is disposed on the gate driving circuit in the non-display area, and
    wherein the metal layer is formed of a same material as an anode electrode of the light emission element and is disposed on a same layer as the anode electrode.

43. The display apparatus according to claim 41, further comprising:
    a first planarization layer and a second planarization layer disposed between the first and second transistors and the light emission element, and
    a blocking structure disposed in the non-display area,
    wherein the metal layer is extended along outermost sidewalls of the first planarization layer and the second planarization layer to contact the power supply line inside the blocking structure in the non-display area.

44. The display apparatus according to claim 41, further comprising:
    wherein the power supply line is formed of a same material as the source electrode and the drain electrode and is disposed on a same layer as the source electrode and the drain electrode.

\* \* \* \* \*